United States Patent
Sakai et al.

(10) Patent No.: US 12,556,166 B2
(45) Date of Patent: Feb. 17, 2026

(54) DUTY RATIO CORRECTION CIRCUIT, CLOCK DISTRIBUTION SYSTEM, AND DUTY RATIO CORRECTION METHOD

(71) Applicant: NEC Corporation, Tokyo (JP)

(72) Inventors: Hajime Sakai, Tokyo (JP); Shinichi Hori, Tokyo (JP)

(73) Assignee: NEC CORPORATION, Tokyo (JP)

( * ) Notice: Subject to any disclaimer, the term of this patent is extended or adjusted under 35 U.S.C. 154(b) by 21 days.

(21) Appl. No.: 18/598,114

(22) Filed: Mar. 7, 2024

(65) Prior Publication Data

US 2024/0322800 A1 Sep. 26, 2024

(30) Foreign Application Priority Data

Mar. 24, 2023 (JP) .................. 2023-047962

(51) Int. Cl.
*H03K 3/017* (2006.01)
*H03K 5/01* (2006.01)
*H03K 5/00* (2006.01)

(52) U.S. Cl.
CPC ............... *H03K 3/017* (2013.01); *H03K 5/01* (2013.01); *H03K 2005/00078* (2013.01)

(58) Field of Classification Search
None
See application file for complete search history.

(56) References Cited

U.S. PATENT DOCUMENTS

| | | | | |
|---|---|---|---|---|
| 2008/0252349 A1* | 10/2008 | Yun | ...................... | H03K 5/1565 327/175 |
| 2009/0146700 A1* | 6/2009 | Kim | ..................... | H03K 5/1565 327/144 |
| 2011/0285441 A1* | 11/2011 | Suzuki | ................ | H03K 5/1565 327/175 |
| 2015/0214932 A1* | 7/2015 | Tomita | ..................... | H03L 7/08 327/156 |

FOREIGN PATENT DOCUMENTS

JP 2016-149637 A 8/2016

* cited by examiner

*Primary Examiner* — Cassandra F Cox
(74) *Attorney, Agent, or Firm* — Sughrue Mion, PLLC

(57) ABSTRACT

A duty ratio correction circuit includes: a duty ratio adjustment circuit that adjusts a duty ratio of an input first clock, based on a control signal, and outputs a second clock being the first clock in which the duty ratio is adjusted; an inverted signal generation circuit that receives the second clock, and outputs an output clock having a phase of the second clock, and an inverted clock being a signal in which a phase of the output clock is inverted; a delay circuit that causes a delay of a delay amount associated to a half cycle of the output clock between the output clock and the inverted clock; and a differential amplifier that outputs, to the duty ratio adjustment circuit, as the control signal, a signal in which a difference in amplitude between the output clock and the inverted clock that are output from the delay circuit is amplified.

10 Claims, 21 Drawing Sheets

Fig. 11

| INPUT CLOCK FREQUENCY [GHz] | HALF CYCLE OF INPUT CLOCK SIGNAL [ps] | DELAY TIME PER INVERTER [ps] | HALF CYCLE OF CLOCK SIGNAL(T/2) / DELAY TIME PER INVERTER(d) | OPTIMUM NUMBER OF INVERTERS IN DELAY CIRCUIT [NUMBER] |
|---|---|---|---|---|
| 0.5 | 1000 | 13.3 | 75.2 | 76 |
| 1 | 500 | 13.3 | 37.6 | 38 |
| 2 | 250 | 13.3 | 18.8 | 18 |
| 3 | 167 | 13.3 | 12.6 | 12 |
| 4 | 125 | 13.3 | 9.4 | 10 |
| 5 | 100 | 13.3 | 7.5 | 8 |
| 6 | 83 | 13.3 | 6.2 | 6 |
| 7 | 71 | 13.3 | 5.3 | 6 |
| 8 | 63 | 13.3 | 4.7 | 4 |
| 9 | 56 | 13.3 | 4.2 | 4 |
| 10 | 50 | 13.3 | 3.75 | 4 |

DUTY RATIO CORRECTION CIRCUIT, CLOCK DISTRIBUTION SYSTEM, AND DUTY RATIO CORRECTION METHOD

This application is based upon and claims the benefit of priority from Japanese Patent Application No. 2023-047962, filed on Mar. 24, 2023, the disclosure of which is incorporated here in its entirety by reference.

TECHNICAL FIELD

The present disclosure relates to a duty ratio correction circuit and the like.

BACKGROUND ART

FIG. 14 is a diagram illustrating supply of a clock signal from a clock signal generation circuit 910 to a digital circuit 920. In the digital circuit 920, a clock signal is used as a reference for a timing of an operation. Generally, using a clock signal in which a duty ratio is 50% enables stably operating the digital circuit 920. However, when a high-speed clock (particularly, a clock of 1 GHz or more) is used, as illustrated in FIG. 14, in some cases, a duty ratio of a clock signal is deviated from 50% at a time of input to the digital circuit 920. As a cause, for example, there is mismatching of impedance between the clock signal generation circuit 910 and the digital circuit 920. As a means for reducing deviation of a duty ratio of a clock signal as described above, a duty ratio correction circuit is known.

FIG. 15 is a diagram illustrating an application example of a general duty ratio correction circuit 900. The duty ratio correction circuit 900 corrects a clock signal being input from the clock signal generation circuit 910 to a preferable duty ratio (e.g., 50%), and supplies the corrected clock signal to the digital circuit 920. FIG. 16 is a diagram illustrating a configuration example of the general duty ratio correction circuit 900. The duty ratio correction circuit 900 is constituted of a duty ratio adjustment circuit 901 and a duty ratio detection circuit 902. The duty ratio adjustment circuit 901 adjusts a duty ratio of an input clock signal to a duty ratio according to a control voltage, and outputs the adjusted clock signal to the duty ratio detection circuit 902. The control voltage is associated with a duty ratio of a clock signal being detected in the duty ratio detection circuit 902. For example, as a duty ratio to be input to the duty ratio detection circuit 902 increases, the control voltage monotonously increases. A circuit example of the duty ratio adjustment circuit 901 is illustrated in FIG. 17. The duty ratio adjustment circuit 901 can be configured by using a threshold value adjustment type inverter. The threshold value adjustment type inverter is an inverter capable of adjusting a threshold value by the control voltage.

FIG. 18 is a diagram illustrating an example of a relationship between a control voltage and a duty ratio in the duty ratio adjustment circuit 901. A vertical axis in FIG. 18 denotes an output duty ratio when an input duty ratio is 50%, and a horizontal axis denotes a control voltage. The input duty ratio is a duty ratio of a clock signal to be input to the duty ratio adjustment circuit 901. The output duty ratio is a duty ratio of a clock signal to be output from the duty ratio adjustment circuit 901. FIG. 18 illustrates that, particularly, in a clock signal of a frequency of 1 GHz or more, it is possible to adjust the output duty ratio in a range from about 10% to 100% by adjusting the control voltage in a range from 350 mV to 650 mV.

FIG. 19 is a diagram illustrating a detailed configuration example of the duty ratio detection circuit 902. The duty ratio detection circuit 902 converts a duty ratio of an input clock signal to a direct current (DC) voltage, and outputs the DC voltage. The duty ratio detection circuit 902 is constituted of an inverted signal generation circuit 903, a low pass filter (LPF) 904, and a differential amplifier 905. The inverted signal generation circuit 903 outputs an output clock signal and an inverted clock signal being a signal acquired by inverting the output clock signal that are output from the duty ratio adjustment circuit 901. The output clock signal and the inverted clock signal that are passed through the LPF 904 are input, to the differential amplifier 905, as a direct current (DC) component according to a duty ratio of each of the clock signals.

The differential amplifier 905 amplifies a difference between a DC component of the clock signal, and a DC component of the inverted clock signal. The amplified difference is output from the differential amplifier 905, as a control voltage.

FIG. 20 is a diagram illustrating a DC component of each of a clock signal and an inverted clock signal, and a control voltage over time. In FIG. 20, a left vertical axis denotes a voltage, a right vertical axis denotes a control voltage, and a horizontal axis denotes time. The duty ratio correction circuit 900 performs feedback control of correcting a duty ratio of an input clock signal by the duty ratio adjustment circuit 901 and the duty ratio detection circuit 902. The feedback control is performed in such a way that a difference between a DC component of an output clock signal, and a DC component of an inverted clock signal at an input of the differential amplifier 905 becomes zero. Specifically, a phenomenon that a difference in DC components becomes zero means that a duty ratio of a clock signal becomes 50%. Therefore, a duty ratio of a clock signal and an inverted clock signal to be output from the inverted signal generation circuit 903 converges to 50%.

In association with the present disclosure, a duty ratio adjustment device is described in PTL 1 (Japanese Unexamined Patent Application Publication No. 2016-149637).

SUMMARY

The LPF 904 included in the duty ratio detection circuit 902 illustrated in FIG. 19 removes a high frequency component from a clock signal and an inverted clock signal, and extracts a DC component. In order to sufficiently remove a high frequency component included in a rectangular wave by the LPF 904, a cutoff frequency of the LPF 904 is required to be sufficiently low with respect to an input clock frequency. However, since an LPF having a low cutoff frequency has a large time constant, long time is required until an output signal is stabilized.

Further, a high frequency component not being able to be sufficiently removed by the LPF 904 and being included in a rectangular wave causes ripple in a control voltage to be output from the differential amplifier 905. Since the ripple in the control voltage becomes a cause of increasing jitter of an output signal, the ripple becomes an obstacle in high-precision duty ratio correction. Therefore, ripple overlapping a control voltage is preferably set to be small. However, in order to sufficiently remove ripple in a control voltage, it is necessary to set a time constant of an integral capacitor 906 disposed at an output of the differential amplifier 905 in FIG. 19 to be large. However, increasing a time constant of the integral capacitor 906 also requires time until an output signal of the differential amplifier 905 is stabilized.

FIG. 21 is a general diagram illustrating an influence of the LPF 904 and the integral capacitor 906 on a control voltage. In FIG. 21, a vertical axis denotes a control voltage, and a horizontal axis denotes time. A waveform A in FIG. 21 illustrates a case in which a cutoff frequency fc of the LPF 904 is relatively low, and a time constant of the integral capacitor 906 is relatively large. A waveform B illustrates a case in which a cutoff frequency of the LPF 904 is high as compared with the case of the waveform A, and the integral capacitor 906 is small as compared with the case of the waveform A.

In the waveform A, ripple in a control voltage is small, but long time is required until the control voltage is stabilized (specifically, until a duty ratio of an output clock signal becomes constant), as compared with the waveform B. In contrast, the waveform B illustrates a case in which the LPF 904 having a small time constant and a high cutoff frequency, and the integral capacitor 906 of a small capacity are used for emphasizing high-speed stabilization of a duty ratio of a clock signal. In this case, a high frequency component derived from a rectangular wave is not sufficiently removed. In addition, in the integral capacitor 906 of a small capacity (specifically, having a small time constant), ripple overlapping a control voltage being output from the differential amplifier 905 cannot be sufficiently removed. For this reason, large ripple remains in the control voltage. As described above, the waveform B indicates that large ripple overlaps a control voltage, although a time constant is small. As described above, there is a tradeoff relationship between high-precision correction of a duty ratio, and high-speed stabilization. For this reason, in a general duty ratio correction circuit, there is a problem that balancing between these parameters is difficult.

An exemplary object of the disclosure is to provide a technique for enabling high-precision duty ratio correction of a clock signal, and high-speed stabilization of a duty ratio.

A Duty Ratio Correction Circuit According to the Present Disclosure Includes:

a duty ratio adjustment means for adjusting a duty ratio of an input first clock signal, based on a control signal, and outputting, as a second clock signal, the first clock signal in which the duty ratio is adjusted;

an inverted signal generation means for receiving the second clock signal, and outputting an output clock signal having a phase of the second clock signal and an inverted clock signal that is a signal in which a phase of the output clock signal is inverted;

a delay means for causing a delay of a delay amount associated to a half cycle of the output clock signal between the output clock signal and the inverted clock signal; and a differential amplification means for outputting, to the duty ratio adjustment means, as the control signal, a signal in which a difference in amplitude between the output clock signal and the inverted clock signal that are output from the delay means is amplified.

A duty ratio correction method according to the present disclosure includes:

adjusting a duty ratio of an input first clock signal, based on a control signal;

outputting a second clock signal being the first clock signal in which the duty ratio is adjusted;

outputting an output clock signal having a phase of the second clock signal, and an inverted clock signal that is a signal in which a phase of the output clock signal is inverted;

causing a delay of a delay amount associated to a half cycle of the output clock signal between the output clock signal and the inverted clock signal; and outputting, as the control signal, a signal in which a difference in amplitude between the output clock signal and the inverted clock signal in which the delay is caused is amplified.

The present disclosure enables high-precision duty ratio correction of a clock signal, and high-speed stabilization of a duty ratio.

BRIEF DESCRIPTION OF THE DRAWINGS

Exemplary features and advantages of the present disclosure will become apparent from the following detailed description when taken with the accompanying drawings in which:

FIG. 11 is a diagram illustrating an example of a relationship between a clock frequency, and the number of inverters at the frequency;

EXAMPLE EMBODIMENT

Example embodiments according to the present disclosure are described in the following. An arrow in each drawing illustrates a direction of a signal in an example embodiment, and does not limit a direction of a signal. An intersection of straight lines indicating a path of a signal in each block diagram does not mean branching or combination of signals intersecting with each other, unless otherwise specified by a black circle mark and the like. In each drawing, an already mentioned element is indicated by a same reference sign, and overlapping description thereof may be omitted.

First Example Embodiment

[Configuration]

Figure 1:
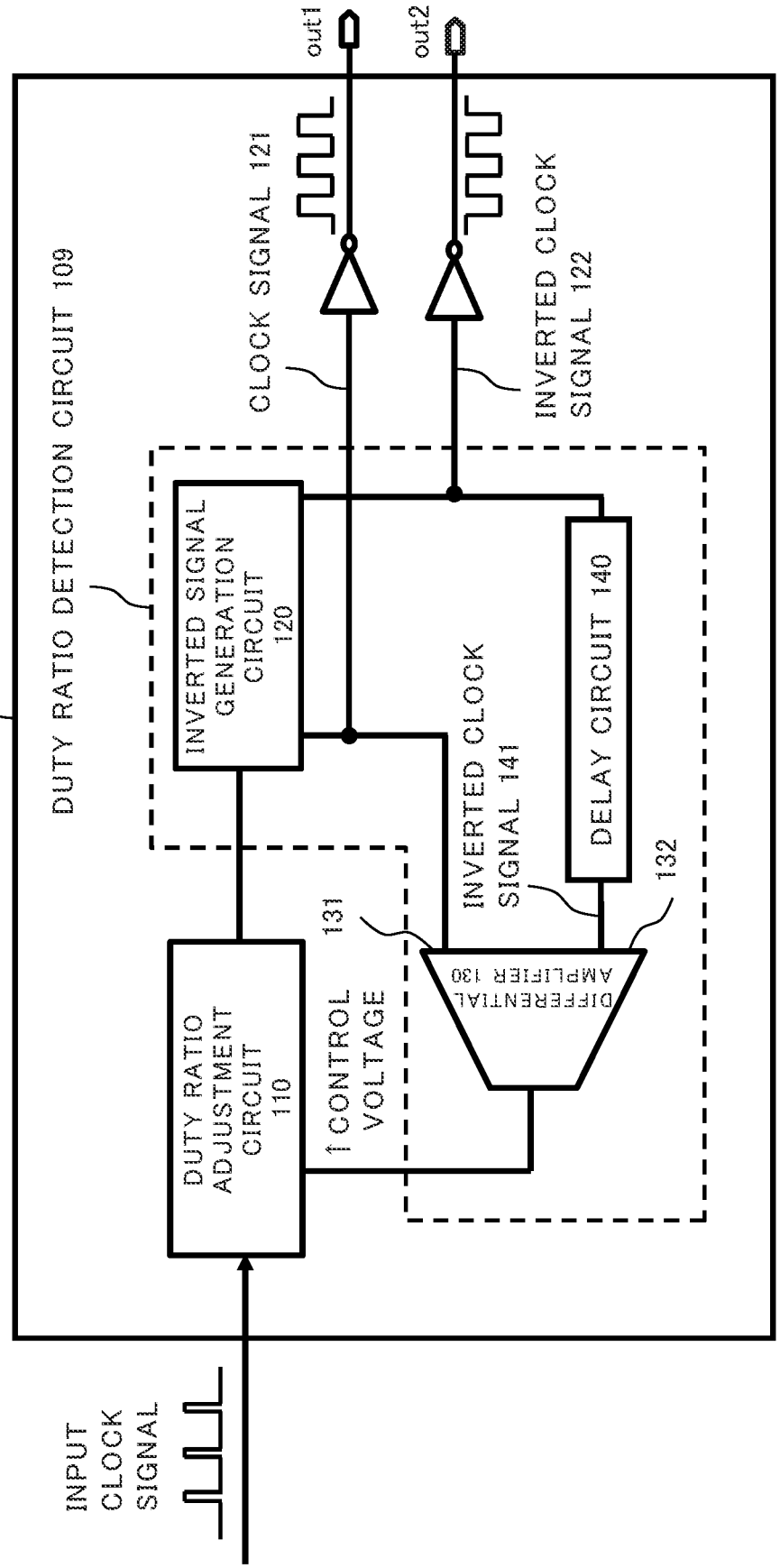
FIG. 1 is a diagram illustrating a configuration example of a duty ratio correction circuit.

FIG. 1 is a diagram illustrating a configuration example of a duty ratio correction circuit 100 according to a present disclosure. The duty ratio correction circuit 100 includes a duty ratio adjustment circuit 110, an inverted signal generation circuit 120, a differential amplifier 130, and a delay circuit 140. The delay circuit 140 is disposed between an inverted clock output of the inverted signal generation circuit 120, and an input 132 being one of differential inputs of the differential amplifier 130. The inverted signal generation circuit 120, the differential amplifier 130, and the delay circuit 140 configure a duty ratio detection circuit 109.

[Operation]

A clock signal (first clock signal) in which a duty ratio is not necessarily 50% is input to the duty ratio adjustment circuit 110. An output (second clock signal) of the duty ratio adjustment circuit 110 is input to the inverted signal generation circuit 120. The inverted signal generation circuit 120 outputs each of a clock signal 121 (output clock signal) having a same phase (in-phase) as a phase of the clock signal input from the duty ratio adjustment circuit 110, and an inverted clock signal 122. The inverted clock signal 122 is a signal in which a phase of the clock signal 121 is inverted. The clock signal 121 and the inverted clock signal 122 are output from an output terminal (out1, out2) to the outside of the duty ratio correction circuit 100 via a buffer such as an inverter. These output clock signals can be used as a clock signal of an unillustrated digital circuit. Note that, the inverted signal generation circuit 120 may output a clock signal input from the duty ratio adjustment circuit 110, as the clock signal 121 as it is.

The clock signal 121 and the inverted clock signal 122 are also input to the differential amplifier 130. The clock signal 121 is input to an input 131 being the other of the differential inputs of the differential amplifier 130. The inverted clock signal 122 is input to the input 132 of the differential amplifier 130 via the delay circuit 140.

The delay circuit 140 delays an input signal by a delay unique to the circuit. The delay circuit 140 is configured of, for example, a general electrical circuit such as an inverter, an amplifier, and a differential amplifier, and a compact device such as a large scale integration (LSI). The delay circuit 140 has a delay amount causing a delay associated to a half cycle of the clock signal 121 between the clock signal 121 and the inverted clock signal 122. Note that, a delay amount of a delay circuit described in each of the present example embodiment and example embodiments thereafter is not necessarily a delay amount associated to an exact half cycle of the clock signal 121. When a delay amount is not equal to a delay amount associated to an exact half cycle of the clock signal 121, a high frequency component to be input to the differential amplifier 130 does not completely become in-phase. However, even in a case as described above, as will be described later, since an amplitude of an input signal to the differential amplifier 130 is output as a difference thereof due to a common mode rejection characteristic, a high frequency component suppressing effect is acquired by the duty ratio correction circuit 100. Specifically, an advantageous effect of each example embodiment of the present application can be acquired, even when "a delay amount" is not equal to a duration of an exact half cycle of the clock signal 121. In view of the above, in description of each of delay circuits described in each example embodiment, it is assumed that "a delay amount associated to a half cycle" with respect to a certain clock signal designates a delay amount of a value being equal to 0.8 time or more but 1.2 time or less (specifically, within +20%) of an exact half cycle of the clock signal.

Note that, a path along which the clock signal 121 propagates from the inverted signal generation circuit 120 to the differential amplifier 130 may be included in the delay circuit 140. In this case, the differential amplifier 130 outputs, as a control signal, a signal in which a difference in amplitude between the clock signal 121 and an inverted clock signal 141 being output from the delay circuit 140 is amplified. However, in this case, the clock signal 121 is not subjected to processing by the delay circuit 140.

Further, the delay circuit 140 may be provided on a path along which the clock signal 121 propagates from the inverted signal generation circuit 120 to the differential amplifier 130. Also, in a configuration as described above, the delay circuit 140 can cause a delay associated to a half cycle of the clock signal 121 between the clock signal 121 and the inverted clock signal 122.

An operation of the duty ratio correction circuit 100 is described in the following. A case in which a delay amount of the delay circuit 140 with respect to the inverted clock signal 122 is set to a half cycle of the clock signal 121 is conceived. In this case, an amplitude of a direct current component of the inverted clock signal 122 is maintained to an amplitude at an input time to the delay circuit 140. On the other hand, a phase of a high frequency component of the input inverted clock signal 122 at an output of the delay circuit 140 is delayed by a half cycle, as compared with an input time. Thus, a high frequency component of the inverted clock signal 141 to be output from the delay circuit 140 is converted into an in-phase signal of the clock signal 121 to be output from the inverted signal generation circuit 120.

The delay circuit 140 converts only a phase of a high frequency component of the input inverted clock signal 122 into in-phase as the phase of the clock signal 121 by a delay function unique to the circuit. Then, a differential state of a direct current component of the inverted clock signal 122 with respect to a direct current component of the clock signal 121 is maintained between an input and an output of the delay circuit 140.

Figure 2:
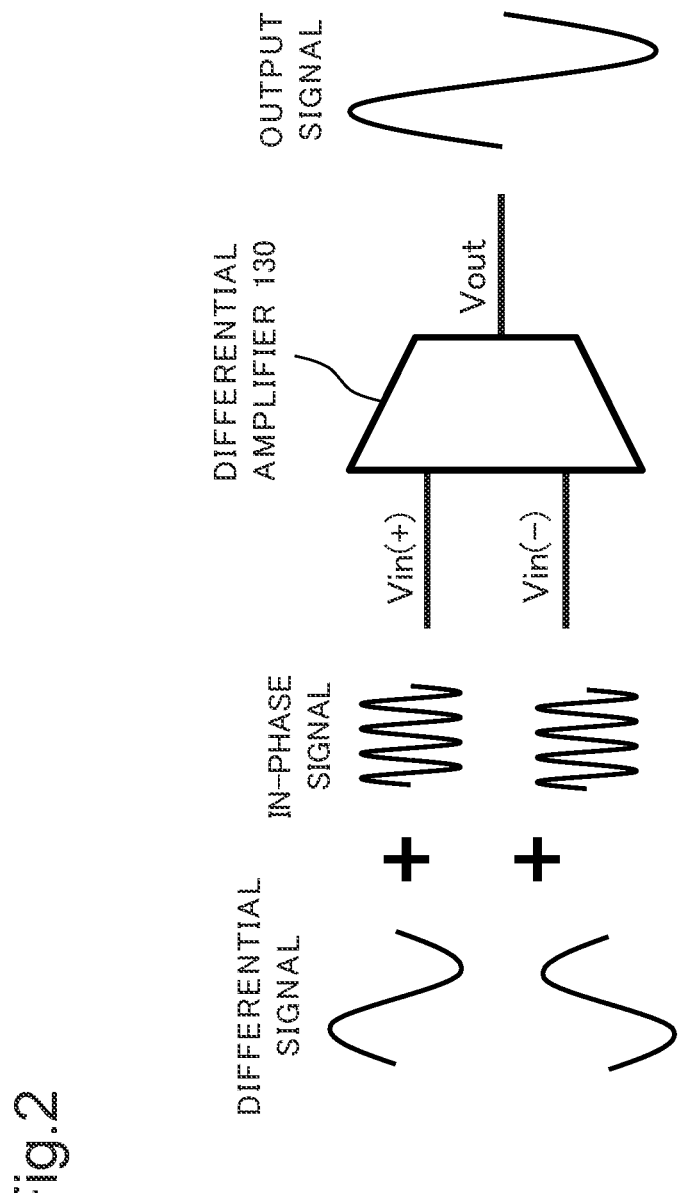
FIG. 2 is a diagram illustrating a common mode rejection function of a differential amplifier.
Figure 3:
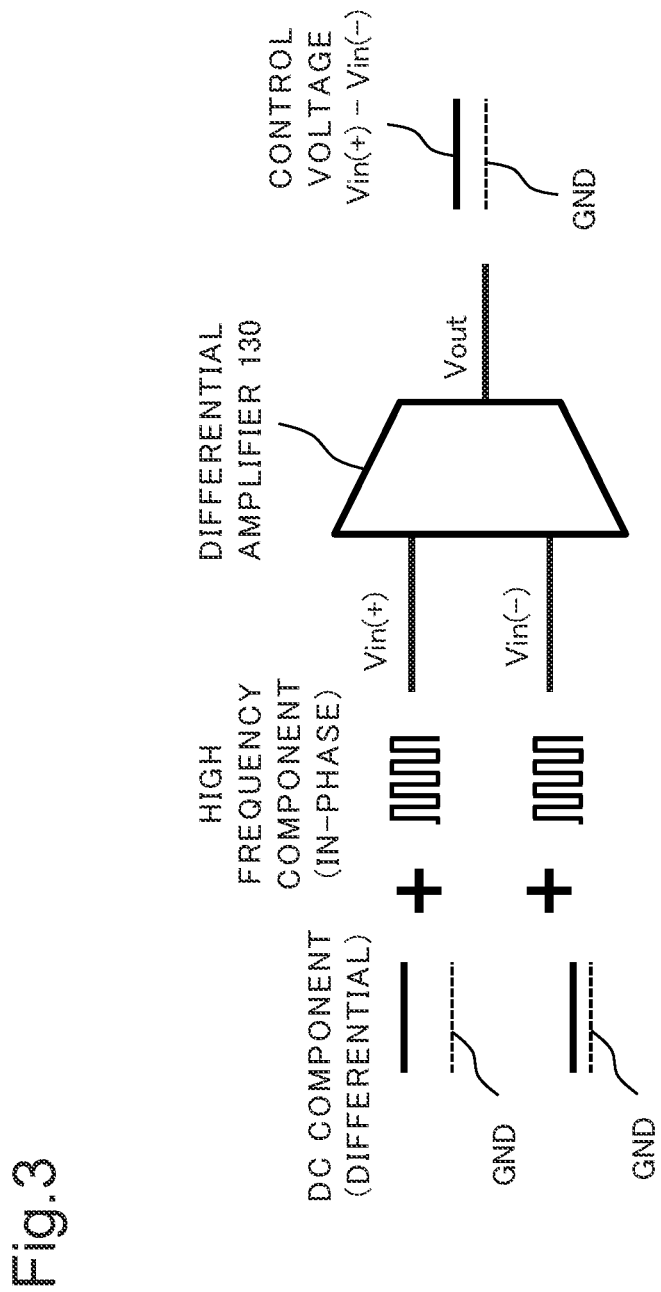
FIG. 3 is a diagram illustrating the common mode rejection function of the differential amplifier.

FIGS. 2 and 3 are diagrams illustrating a common mode rejection function of the differential amplifier 130. FIG. 2 illustrates an operation example in a case in which a differential signal of a relatively low frequency and an in-phase signal of a relatively high frequency are input to differential inputs Vin(+) and Vin(−) of the differential amplifier 130. At an output Vout of the differential amplifier 130, an amplitude of a high frequency signal being an in-phase signal is suppressed, but an amplitude of a differential signal having an opposite phase is added and increases. Specifically, the differential amplifier 130 has a common mode rejection characteristic in which a difference of a signal to be input is amplified, and an in-phase signal (e.g., common mode noise) is removed.

FIG. 3 illustrates an operation example in a case in which a frequency component of a clock signal as a high frequency component of a same phase, and a direct current component of the clock signal are input to the differential amplifier 130. In FIG. 3, GND denotes a position where a direct current component is zero. Further, in FIG. 3, an amplitude of a direct current component to be input to the Vin(+) side of the differential amplifier 130 is smaller than an amplitude of a direct current component to be input to the Vin(−) side. The differential amplifier 130 outputs a difference in amplitude between these direct current components from Vout. Further, high frequency components being in-phase input to the differential amplifier 130 is removed by a common mode rejection characteristic of the differential amplifier 130. Consequently, the differential amplifier 130 outputs a direct current signal in which ripple is suppressed. In the present example embodiment, the input 131 in FIG. 1 is associated with Vin(+) in FIG. 2, and the input 132 is associated with Vin(−).

In the duty ratio correction circuit 100 having a configuration as described above, it is possible to omit a low pass filter and an integral capacitor used in a general duty ratio correction circuit to extract a direct current component by removing a high frequency component, and remove ripple in a control voltage. Consequently, the duty ratio correction circuit 100 enables high-precision duty ratio correction of a clock signal, and high-speed stabilization of a duty ratio.

Note that, in the above example, it is preferable that a phase of a high frequency component to be input to the differential amplifier 130 completely becomes in-phase to sufficiently acquire an advantageous effect of a common mode rejection characteristic of the differential amplifier 130. However, even when a high frequency component does not have a completely same phase, a high frequency component suppressing effect is acquired by the duty ratio correction circuit 100, because an amplitude of an input signal to the differential amplifier 130 is output as a difference thereof due to a common mode rejection characteristic.

Figure 4:
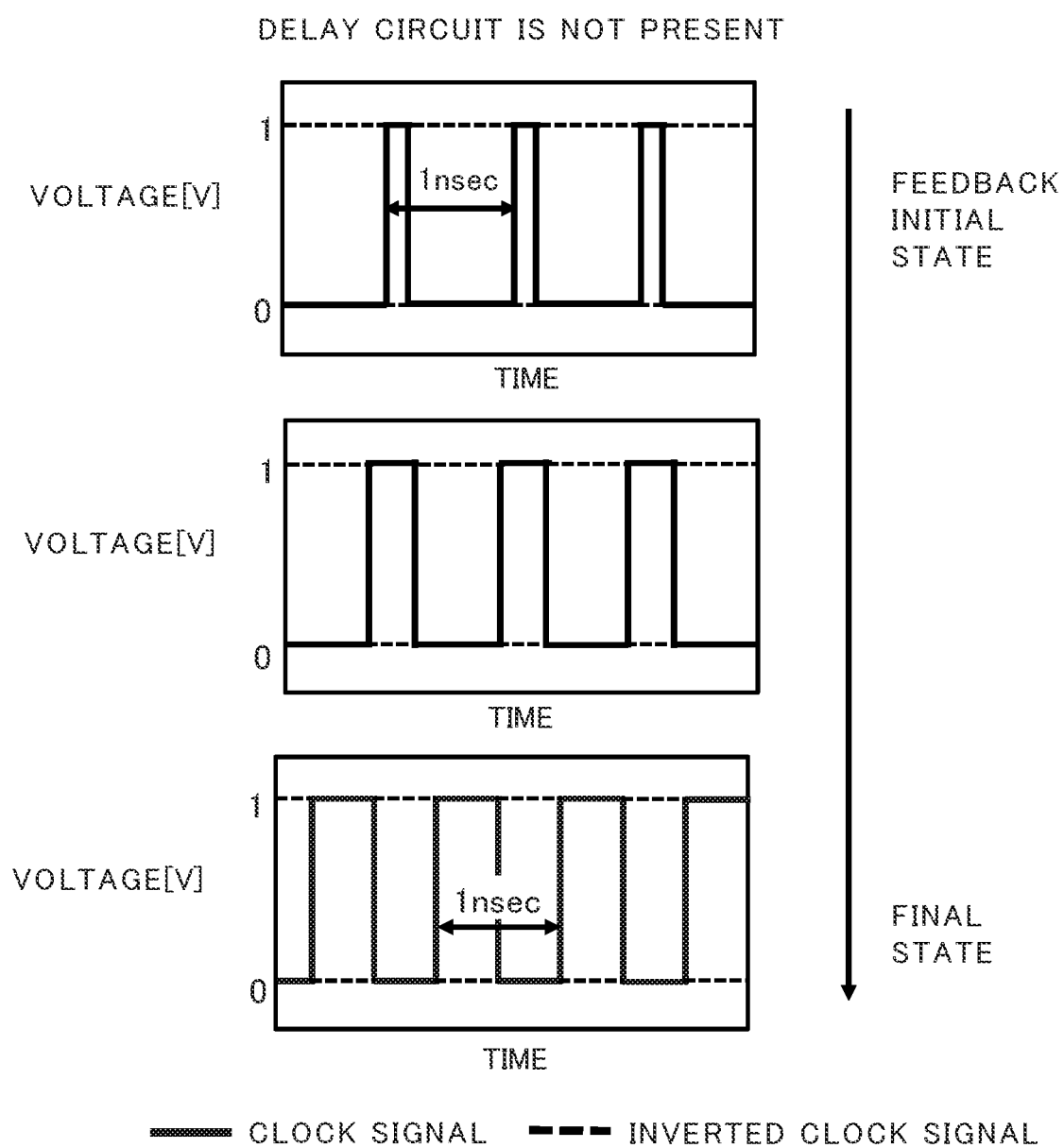
FIG. 4 is a diagram illustrating an example of a change in a waveform of a clock signal and an inverted clock signal to be input to the differential amplifier.
Figure 5:
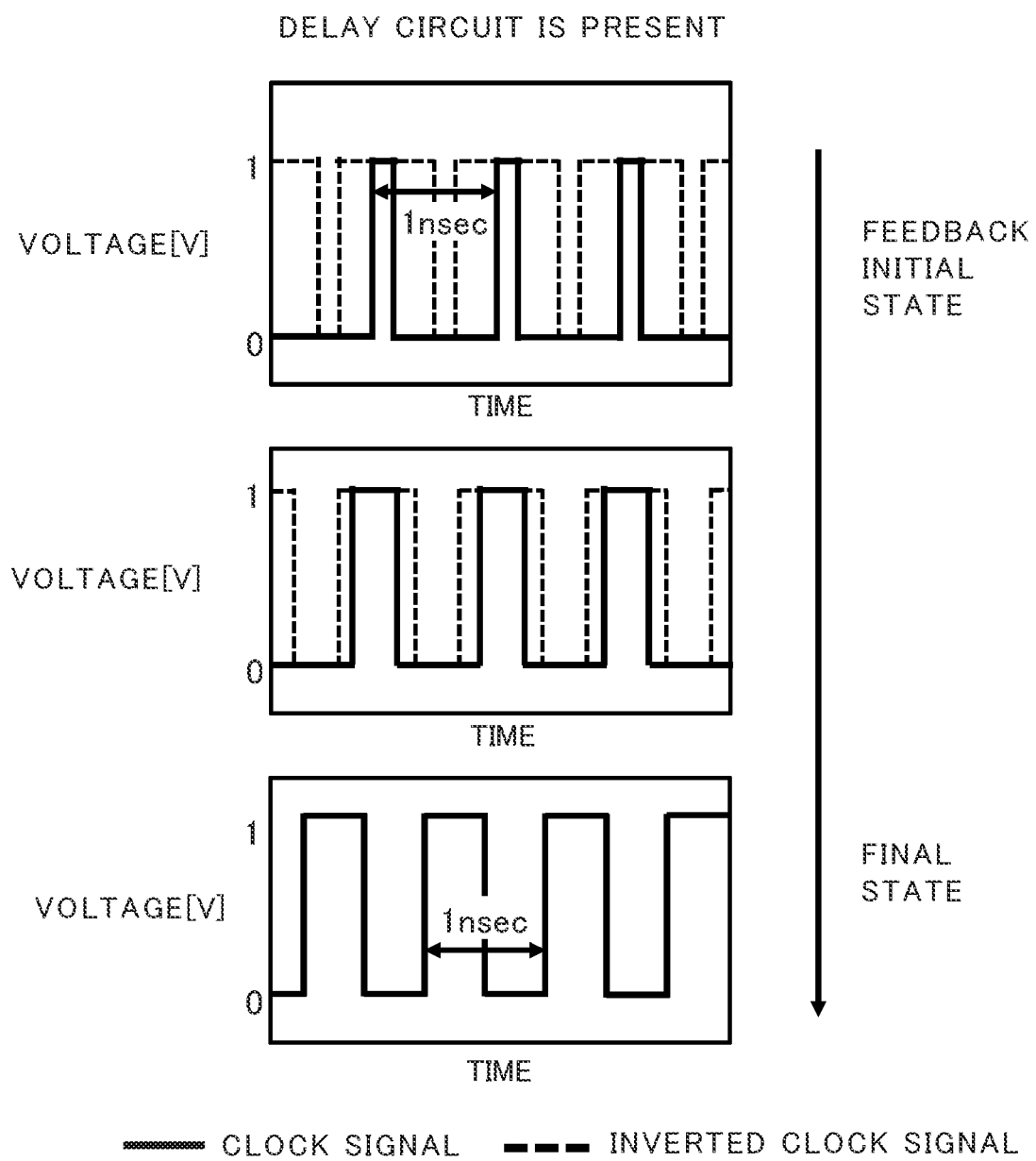
FIG. 5 is a diagram illustrating an example of a change in a waveform of a clock signal and an inverted clock signal to be input to the differential amplifier.

FIGS. 4 and 5 are diagrams illustrating an example of a change in waveform of the clock signal 121 and the inverted clock signal 141 to be input to the differential amplifier 130. In FIGS. 4 and 5, a waveform of the clock signal 121 and the inverted clock signal 141 to be input to the differential amplifier 130 changes from an upper waveform to a lower waveform as time elapses by feedback control by the duty ratio adjustment circuit 110. FIGS. 4 and 5 illustrate, as an example, a case in which a frequency of a clock signal is 1 GHz. Therefore, a cycle of a clock signal to be input and output in the differential amplifier 130 is 1 nanosecond (nsec), and a half cycle thereof is 0.5 nsec.

FIG. 4 illustrates an example in a case in which the duty ratio correction circuit 100 does not include the delay circuit 140. A solid line in FIG. 4 denotes the clock signal 121, and a dashed line in FIG. 4 denotes the inverted clock signal 122. In FIG. 4, the solid line and the dashed line overlap each other at a rising time and a falling time of a waveform. In FIG. 4, the clock signal 121 and the inverted clock signal 122 to be input to the differential amplifier 130 have a relationship in which phases are opposite to each other. In this case, since a high frequency component included in a rectangular wave becoming a cause of ripple is not in the same phase, the high frequency component is not suppressed in the differential amplifier 130 having a common mode rejection characteristic.

FIG. 5 illustrates an example in a case in which the duty ratio correction circuit 100 includes the delay circuit 140. A solid line in FIG. 5 denotes the clock signal 121, and a dashed line in FIG. 5 denotes the inverted clock signal 141. FIG. 5 illustrates a waveform example of the clock signal 121 and the inverted clock signal 141 to be input to the differential amplifier 130. The clock signal 121 and the inverted clock signal 141 to be input to the differential amplifier 130 have a relationship in which phases are the same by an operation of the delay circuit 140.

In FIG. 5, in a state in which a duty ratio converges to 50% by progress of feedback control, a high frequency component of each of a clock signal and an inverted clock signal is converted into an in-phase signal, and the in-phase signal is input to the differential amplifier 130. Then, the high frequency component included in a rectangular wave becoming a cause of ripple is suppressed by utilizing the above-described common mode rejection characteristic of the differential amplifier 130.

Figure 6:
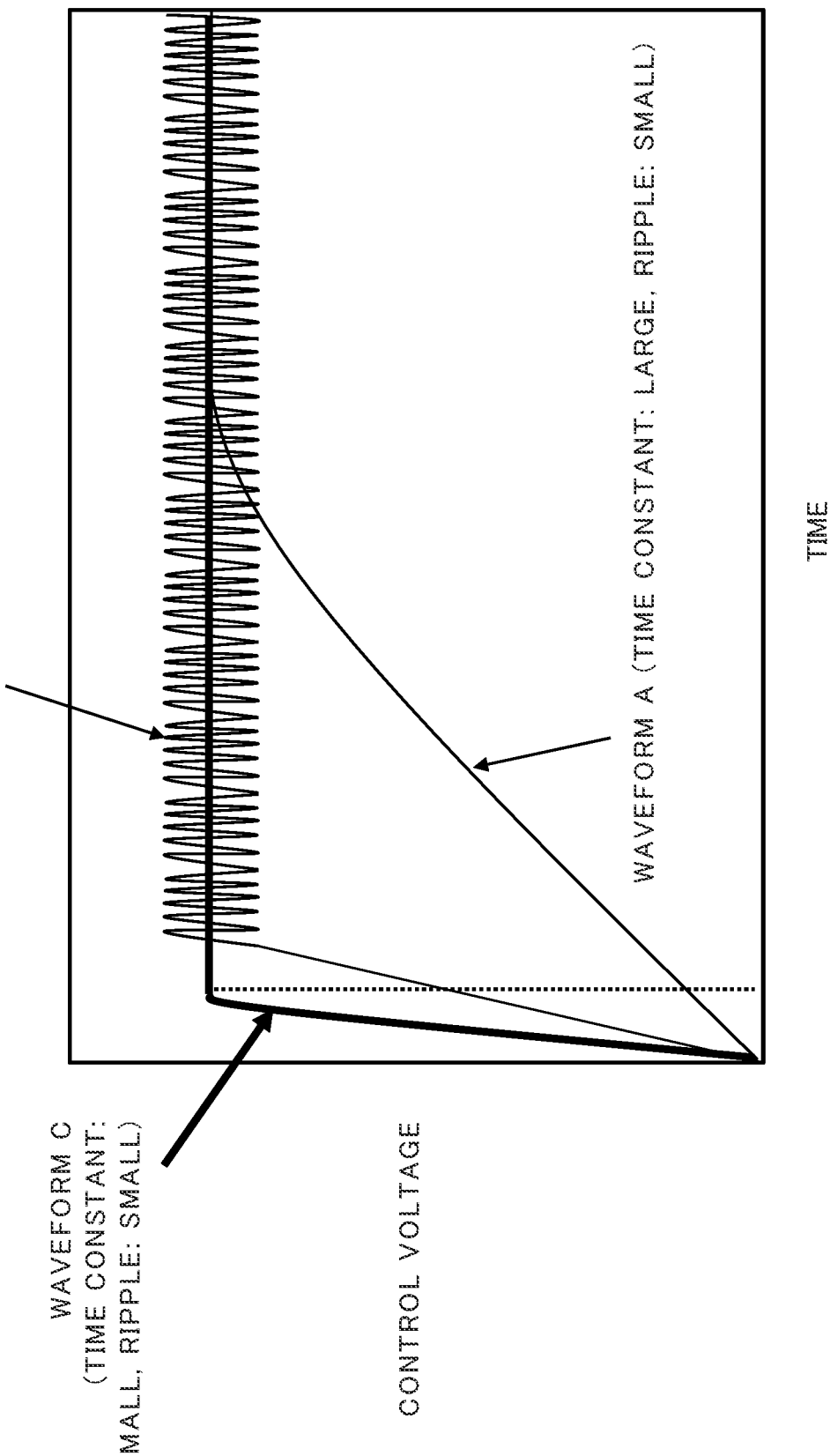
FIG. 6 is a diagram illustrating an example of a change in a control voltage in a duty ratio correction circuit.
Figure 21:
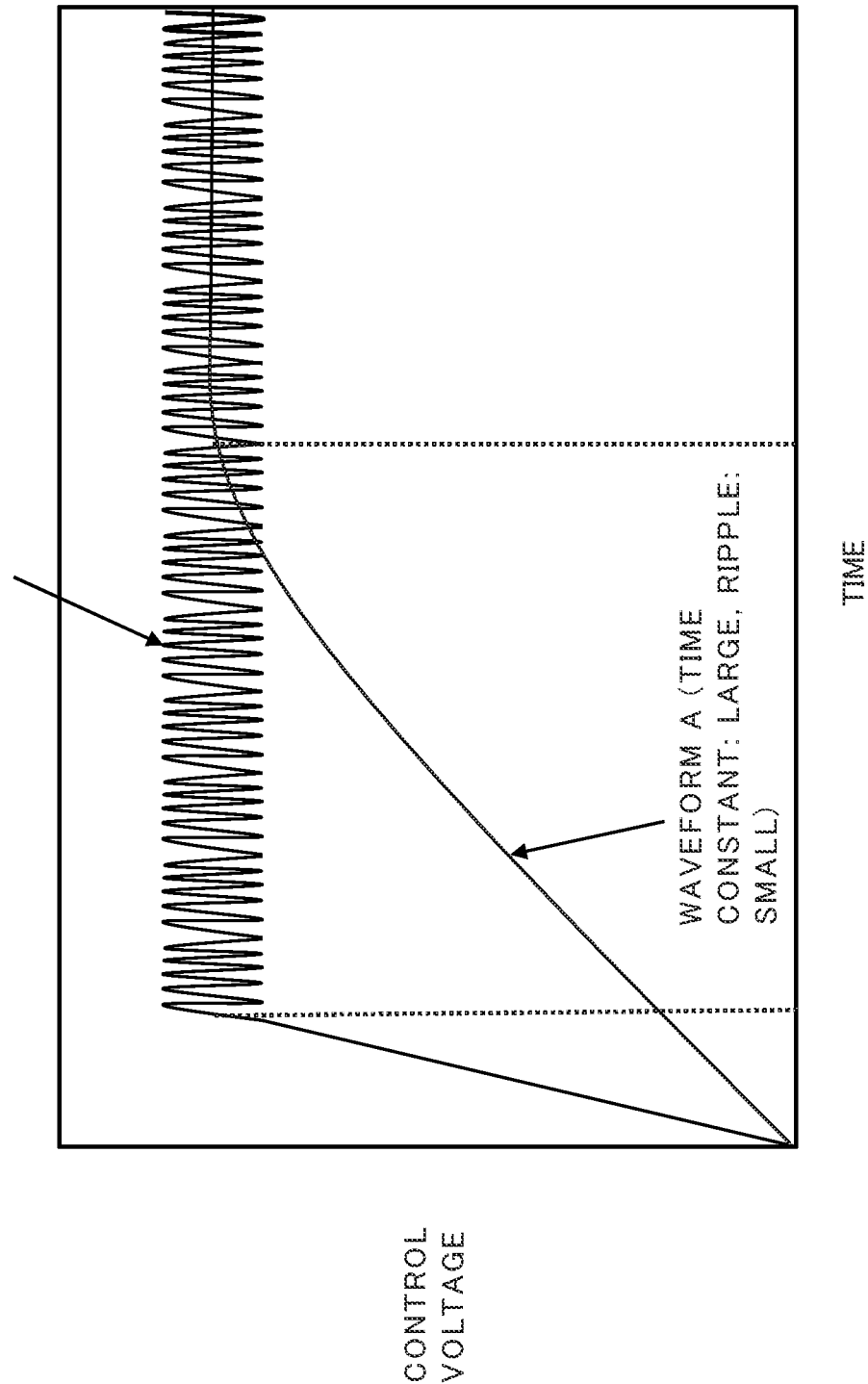
FIG. 21 is a general diagram illustrating an influence of an LPF and an integral capacitor on a control voltage.

FIG. 6 is a diagram in which an example of a change in a control voltage in the duty ratio correction circuit 100 according to the present disclosure is appended to a graph in FIG. 21. As illustrated in FIG. 6, in the duty ratio correction circuit 100, a high frequency component included in the clock signal 121 and the inverted clock signal 141 is suppressed by the differential amplifier 130. Therefore, it is possible to omit an LPF and an integral capacitor being required in a general circuit, and achieve a state in which a control voltage has small ripple with a small time constant (specifically, in a short time). Consequently, the duty ratio correction circuit 100 enables high-precision duty ratio correction of a clock signal, and high-speed stabilization of a duty ratio.

Second Example Embodiment

[Configuration]

Figure 7:
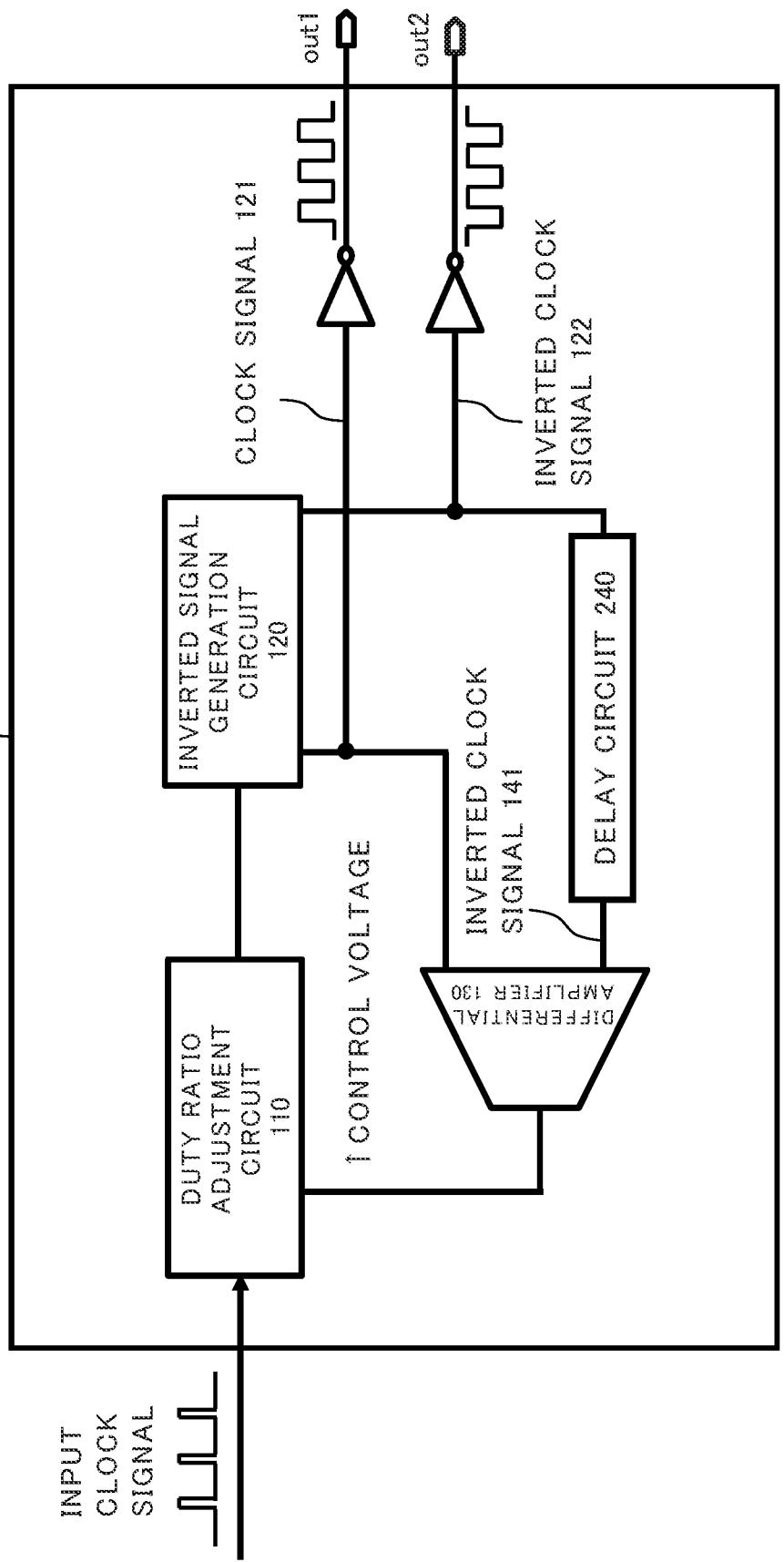
FIG. 7 is a diagram illustrating a configuration example of the duty ratio correction circuit.
Figure 8:
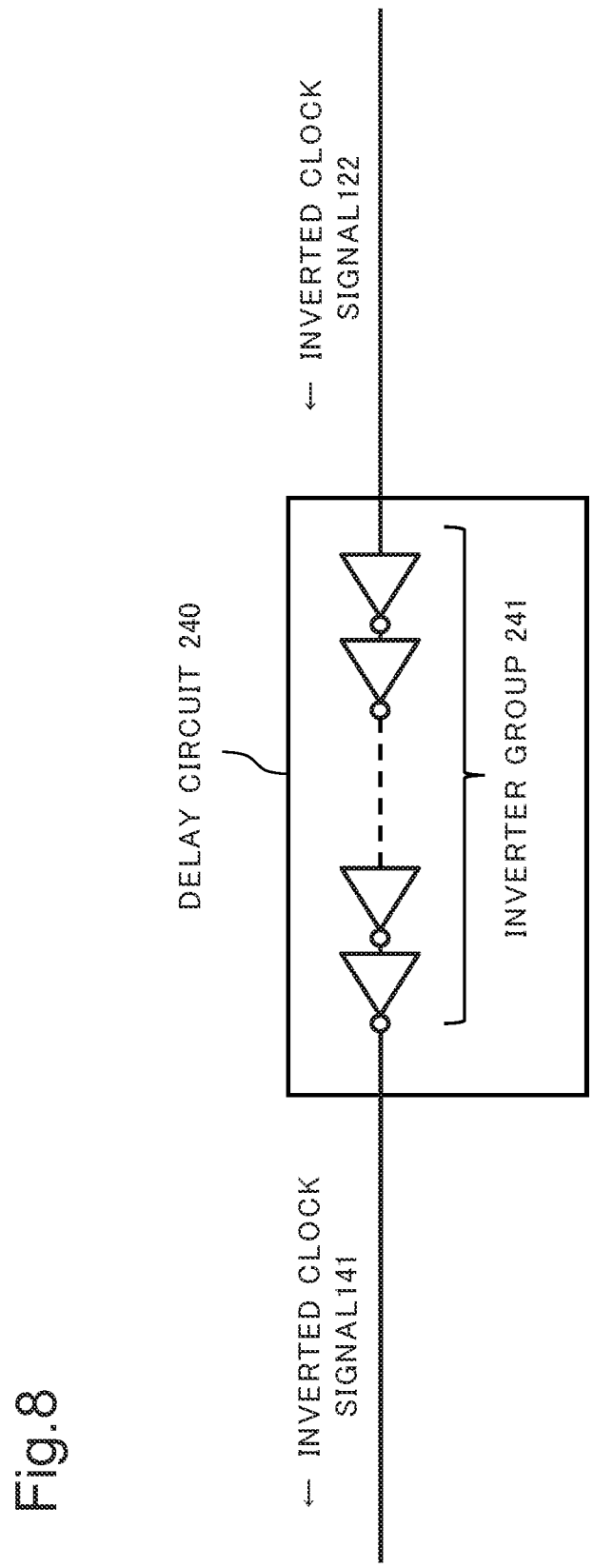
FIG. 8 is a diagram illustrating a configuration example of a delay circuit.

FIG. 7 is a diagram illustrating a configuration example of a duty ratio correction circuit 101 according to a present disclosure. The duty ratio correction circuit 101 includes a delay circuit 240, in place of the delay circuit 140 of the duty ratio correction circuit 100. FIG. 8 is a diagram illustrating a configuration example of the delay circuit 240. The delay circuit 240 includes an inverter group 241. In the inverter group 241, $2n$ inverters are connected in series. n is a natural number.

[Operation]

An inverted clock signal 122 is input to the delay circuit 240. Since the delay circuit 240 is constituted of even-numbered inverters, a logic and a direct current component of the input inverted clock signal 122 are output from the delay circuit 240, as an inverted clock signal 141 without being affected by the delay circuit 240. On the other hand, a high frequency component of the inverted clock signal 122 receives time delay associated to a half cycle of the inverted clock signal 122 by the delay circuit 240. The number of inverters included in the inverter group 241 is set in such a way that a high frequency component of the clock signal 121, and a high frequency component of the inverted clock signal 141 become an in-phase signal at an input of a differential amplifier 130 by delay by the delay circuit 240. In this way, the delay circuit 240 converts only a high frequency component of the inverted clock signal 141 into an in-phase signal, while maintaining a differential state of a direct current component with respect to the clock signal 121, and inputs the in-phase signal to the differential amplifier 130, as the inverted clock signal 122. The duty ratio correction circuit 101 including a configuration as described above also enables high-precision duty ratio correction of a clock signal, and high-speed stabilization of a duty ratio.

Third Example Embodiment

[Configuration]

Figure 9:
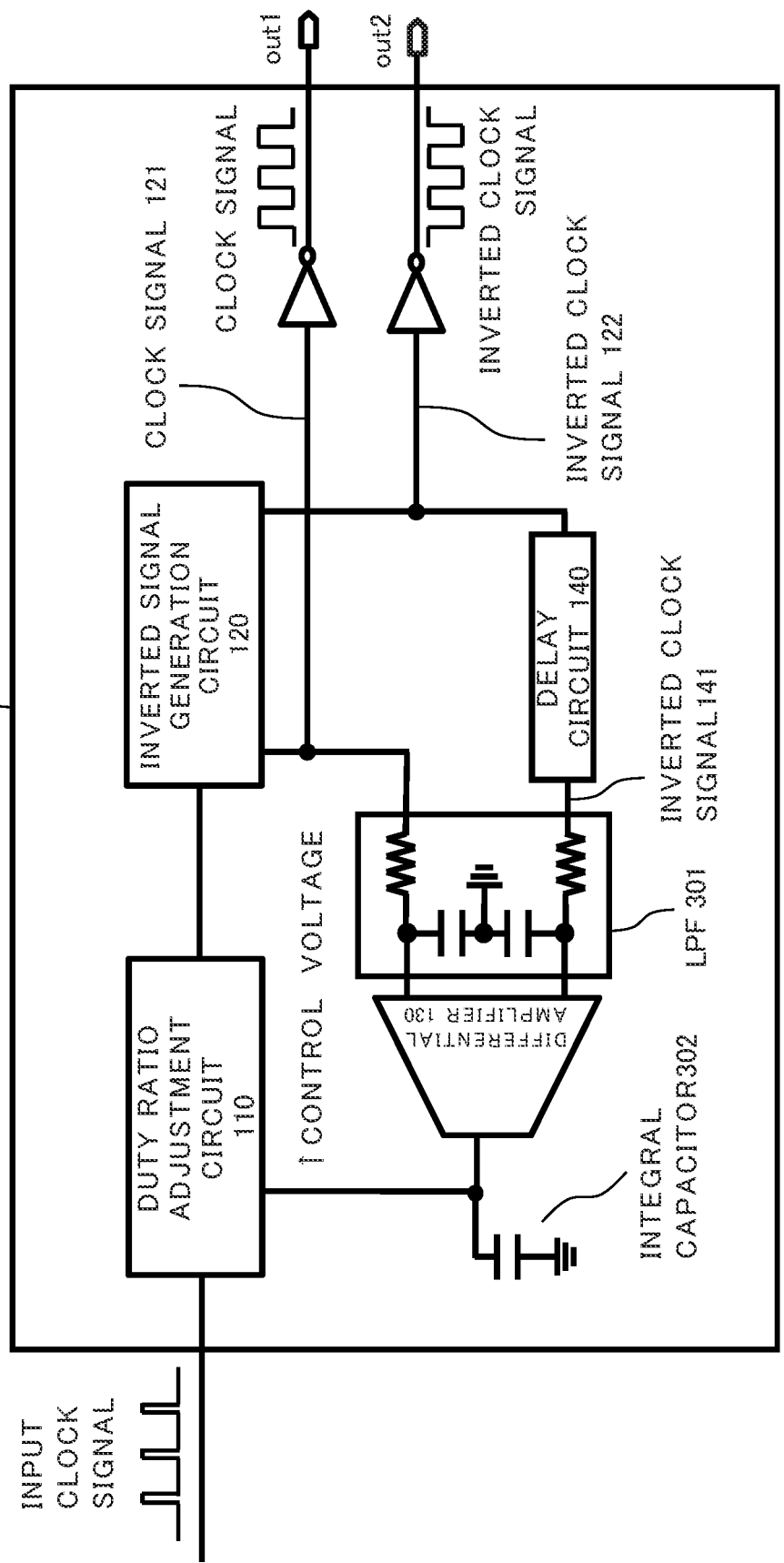
FIG. 9 is a diagram illustrating a configuration example of a duty ratio correction circuit.

FIG. 9 is a diagram illustrating a configuration example of a duty ratio correction circuit 102 according to a present disclosure. The duty ratio correction circuit 102 is different from the duty ratio correction circuit 100 in a point that the duty ratio correction circuit 102 includes a low pass filter (LPF) 301 and an integral capacitor 302. The LPF 301 suppresses a high frequency component of a clock signal 121 and an inverted clock signal 141. A cutoff frequency of the LPF 301 is higher than that of an LPF to be used in a general duty ratio correction circuit. The integral capacitor 302 is provided between an output of a differential amplifier 130, and a grounding point. A capacity of the integral capacitor 302 is smaller than that of an integral capacitor to be used in a general duty ratio correction circuit.

[Operation]

An output of the differential amplifier 130 may include a slight amount of a high frequency component that cannot be removed by a common mode rejection characteristic alone, and is derived from a rectangular wave of the clock signal 121 and the inverted clock signal 141. Then, a high frequency component as described above becomes a cause of slight ripple in a control voltage. The duty ratio correction circuit 102 according to the present disclosure suppresses a high frequency component as described above by using the LPF 301 and the integral capacitor 302. Since most of a high frequency component is removed by the differential amplifier 130, the LPF 301 can set a cutoff frequency to be high, as compared with an LPF to be used for ripple removal in a general duty ratio correction circuit. Further, in the duty ratio correction circuit 102, a capacity of the integral capacitor 302 can also be set to be small, as compared with a configuration to be used for ripple removal in a general duty ratio correction circuit. The duty ratio correction circuit 102 including a configuration as described above enables high-precision duty ratio correction of a clock signal, and high-speed stabilization of a duty ratio. Further, the duty ratio correction circuit 102 can further suppress ripple by using, as the LPF 301 and the integral capacitor 302, a compact component, as compared with a configuration to be used in a general duty ratio correction circuit.

Fourth Example Embodiment

[Configuration]

Figure 10:
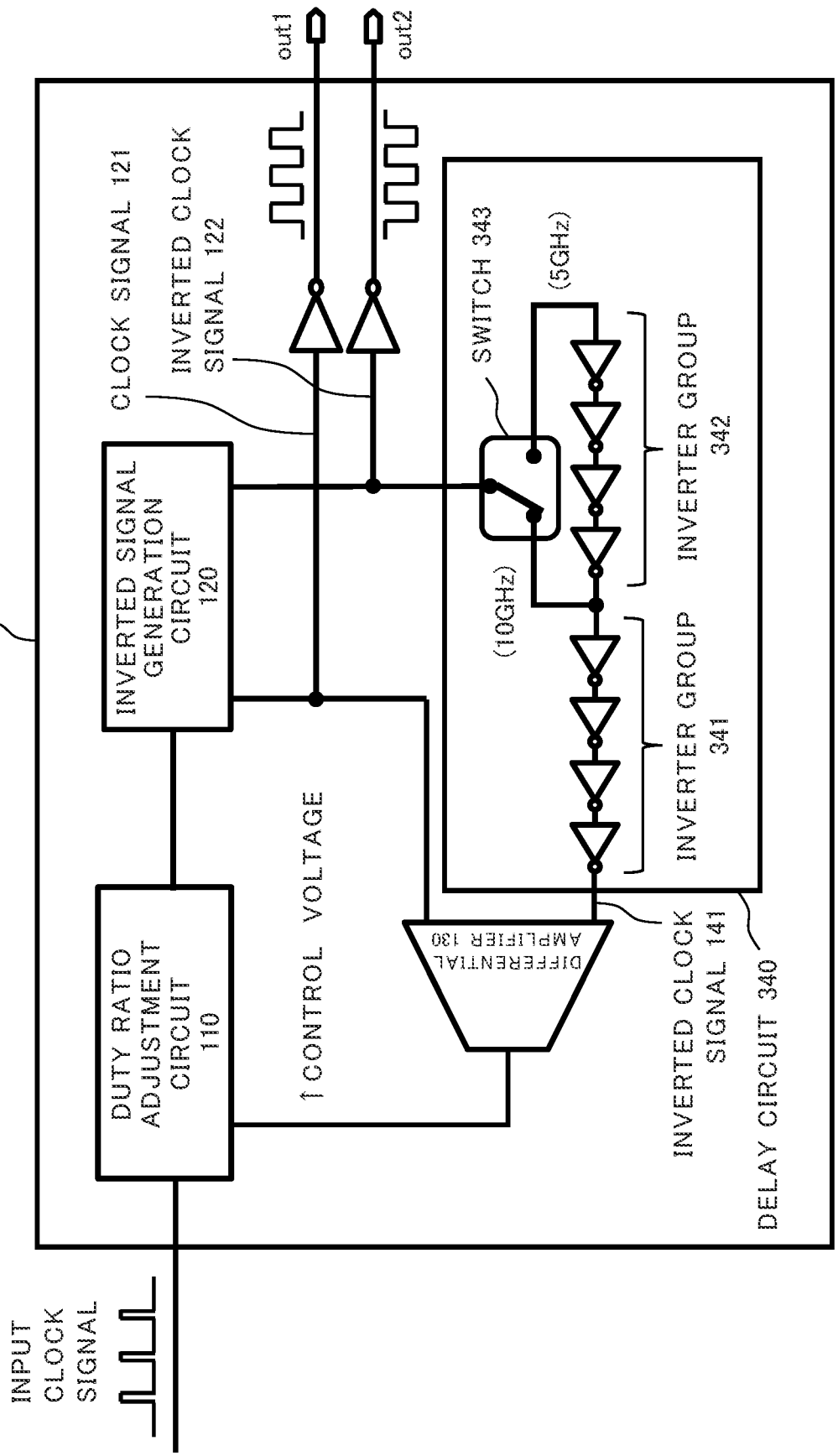
FIG. 10 is a diagram illustrating a configuration example of the duty ratio correction circuit.

FIG. 10 is a diagram illustrating a configuration example of a duty ratio correction circuit 103 according to a present disclosure. The duty ratio correction circuit 103 is different from the duty ratio correction circuit 101 in a point that the duty ratio correction circuit 103 includes a delay circuit 340, in place of the delay circuit 240. The delay circuit 340 can switch the number of inverters for delaying an inverted clock signal.

[Operation]

The delay circuit 340 includes inverter groups 341 and 342. Both of the inverter groups 341 and 342 include a plurality of inverters, and the inverters are connected in series. A delay amount of the inverter group 341 is D1, and a delay amount of the inverter group 342 is D2. A switch 343 connects an output of an inverted clock signal 122 of an inverted signal generation circuit 120 to an input of the inverter group 341 or an input of the inverter group 342. A configuration as described above enables to change a delay amount of the delay circuit 340 by switching the switch 343. Specifically, a delay amount of the delay circuit 340 is set to either of the delay amount D1 of the inverter group 341, or D1+D2 being a sum of the delay amounts of the inverter groups 341 and 342. Switching connection of the inverter group (specifically, switching a delay amount) is performed, for example, by controlling the switch 343 according to a frequency of the inverted clock signal 122.

The delay circuits 240 and 340 are configuration examples of the delay circuit 140, and a constituent element of these delay circuits is not limited to an inverter. Specifically, the delay circuit 140 may utilize a delay amount unique to the circuit, and, for example, adjust a delay amount by switch control. At this occasion, it is preferable that only a high frequency component can be converted into an in-phase signal, while maintaining a differential state of a direct current component with respect to a clock signal having a different frequency. The delay circuits 240 and 340 include a plurality of inverters, as delay elements. Then, a delay amount of the delay circuits 240 and 340 is adjusted by switching the number of series connections of delay elements.

So far, the delay circuits 240 and 340 including an inverter group have been described. Next, an example of a determination procedure on the number of inverters included in an inverter group is described. The delay circuits 240 and 340 are configured in such a way that the input inverted clock signal 122 passes through even-numbered inverters, and is output as an inverted clock signal 141 to maintain a differential state of a direct current component. The number N of inverters necessary for converting a phase of a high frequency component of the inverted clock signal 141 to in-phase as a phase of a clock signal 121 is determined as follows. Note that, it is assumed that a duration of a half cycle of the inverted clock signal 122 to be input is T/2, and a delay time per inverter is d.

$$N = (T/2)/d = T/(2d)$$

An even number closest to a value derived from the above equation becomes the number of inverters suitable for converting a high frequency component into an in-phase signal, while maintaining a differential state of a direct current component.

FIG. 11 is a diagram illustrating an example of a relationship between a clock frequency, and the number of inverters at the frequency. Since a cycle of a clock signal is different depending on a frequency of the clock signal, a delay amount required for a delay circuit also differs depending on a clock frequency. Referring to FIG. 11 enables to know the number of inverters according to a clock frequency. For example, when a clock signal having a clock frequency of 1 GHz is input to the duty ratio correction circuit 103, thirty-eight inverters as an inverter group are connected in series. When a clock signal having a clock frequency of 2 GHz is input to the duty ratio correction circuit 103, eighteen inverters as an inverter group are connected in series.

In this case, in the duty ratio correction circuit 103, the inverter group 341 may be constituted of eighteen inverters, and the inverter group 342 may be constituted of twenty inverters. When a frequency of a clock signal is 1 GHz, since delay associated to thirty-eight inverters is required, the switch 343 is switched in such a way that the inverted clock signal 122 passes through both of the inverter groups 341 and 342. When a frequency of a clock signal is 2 GHZ, since a delay amount is only required to be an amount associated to eighteen inverters, the switch 343 is switched in such a way that the inverted clock signal 122 passes only through the inverter group 341.

In this way, the duty ratio correction circuit 103 includes the switch 343, and two groups being the inverter groups 341 and 342. Thus, the duty ratio correction circuit 103 enables to perform duty ratio correction with respect to two types of clock signals having a different frequency by controlling the number of inverters of a delay circuit, specifically, a delay time, by controlling the switch 343. Further, the delay circuit 340 may be configured in such a way that an inverter group is further prepared, and a delay amount of three types or more can be set by a switch.

Switching of the switch 343 may be performed by a maintainer of equipment. Alternatively, the duty ratio correction circuit 103 may further include a frequency counter that measures a frequency of a clock signal to be input. The duty ratio correction circuit 103 may switch the switch 343 in such a way that a more preferred delay amount can be acquired according to a clock frequency measured by the frequency counter.

The duty ratio correction circuit 103 including a configuration as described above enables high-precision duty ratio correction of a clock signal, and high-speed stabilization of a duty ratio. Further, the duty ratio correction circuit 103 enables duty ratio correction with respect to a plurality of clock signals having a different frequency.

Fifth Example Embodiment

[Configuration]

Figure 12:
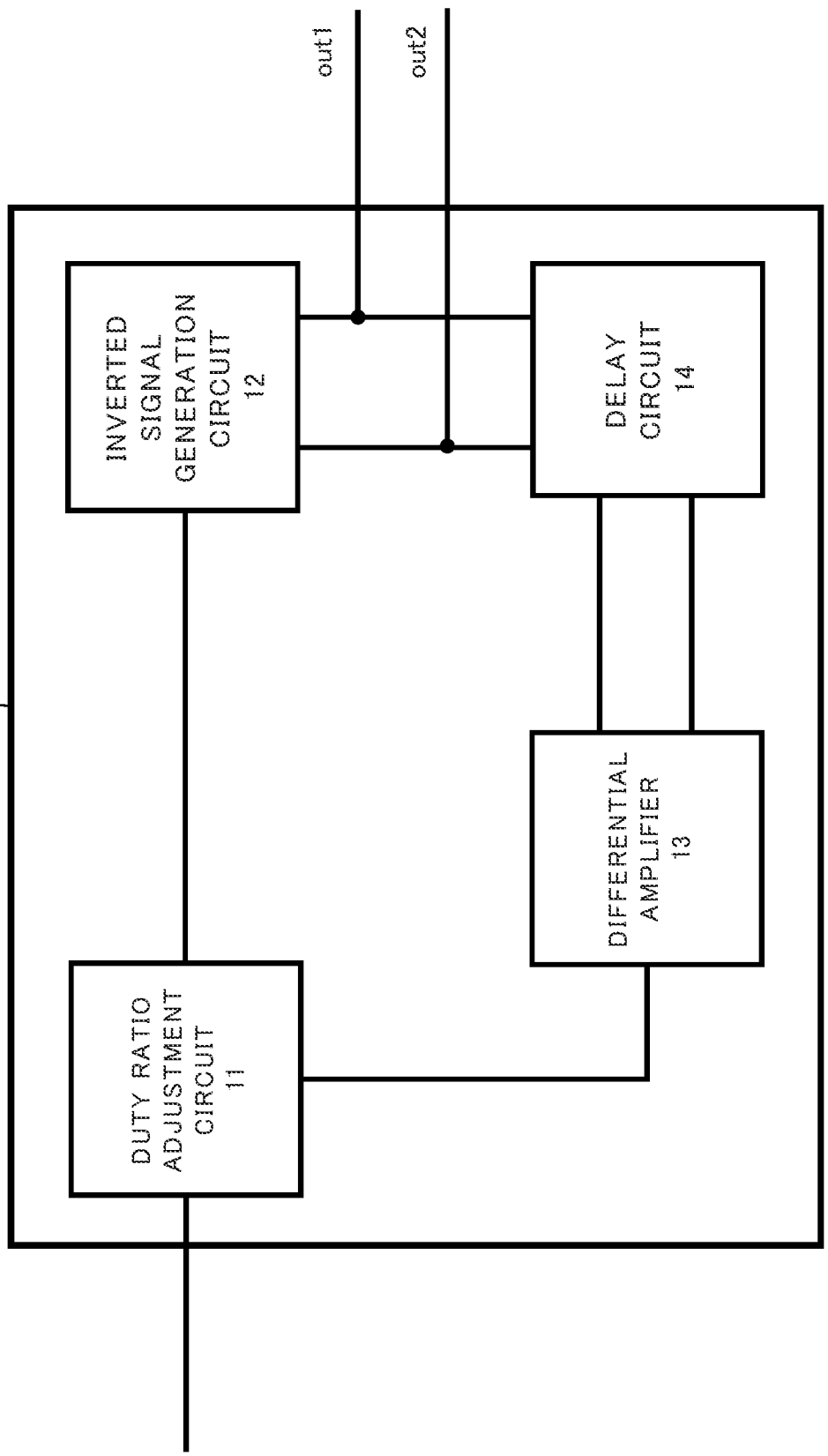
FIG. 12 is a diagram illustrating a configuration example of a clock distribution system.

FIG. 12 is a diagram illustrating a configuration example of a duty ratio correction circuit 10 according to a present disclosure. The duty ratio correction circuit 10 includes a duty ratio adjustment circuit 11, an inverted signal generation circuit 12, a differential amplifier 13, and a delay circuit 14.

[Operation]

The duty ratio adjustment circuit 11 adjusts a duty ratio of a first clock signal being an input clock signal, based on a control signal, and outputs, as a second clock signal, the first input clock signal in which the duty ratio is adjusted. The duty ratio adjustment circuit 11 is one example of a duty ratio adjustment means.

The second clock signal is input from the duty ratio adjustment circuit 11 to the inverted signal generation circuit 12. The inverted signal generation circuit 12 outputs an output clock signal having a phase of the second clock signal, and an inverted clock signal being a signal in which a phase of the output clock signal is inverted. The inverted signal generation circuit 12 is one example of an inverted signal generation means. Note that, the second clock signal may be input to the inverted signal generation circuit 12, and output to the delay circuit 14 without being inverted in the inverted signal generation circuit 12.

The delay circuit 14 has a delay amount causing a delay associated to a half cycle of an output clock signal between the output clock signal and an inverted clock signal. The delay circuit 14 is one example of a delay means. In other words, the delay circuit 14 causes a delay difference corresponding to a half cycle of a clock between two clock signals to be input to the differential amplifier 13. Note that, a function of the delay circuit 14 may be achieved by giving a delay only to either of an output clock signal and an inverted clock signal. Specifically, in this case, the other of the output clock signal and the inverted clock signal may be input as it is from the inverted signal generation circuit 12 to the differential amplifier 13.

The differential amplifier 13 outputs, as a control signal, a signal in which a difference in amplitude between the output clock signal and the inverted clock signal being output from the delay circuit 14 is amplified. The differential amplifier 13 is one example of a differential amplification means. The control signal output from the differential amplifier 13 is input to the duty ratio adjustment circuit 11.

In the duty ratio correction circuit 10, since a high frequency component of a clock signal to be input to the differential amplifier 13 becomes a same phase, a high frequency component is reduced at an output of the differential amplifier 13. Consequently, in the duty ratio adjustment circuit 11, an influence of ripple derived from a high frequency component is reduced in adjusting a duty ratio of a clock signal, based on a difference in direct current component. Further, in the duty ratio correction circuit 10, since it is not necessarily required to provide an LPF having a low cutoff frequency, and an integral capacitor having a large capacity at an input/output of the differential amplifier 13, a duty ratio can be stabilized at a high speed. Therefore, the duty ratio correction circuit 10 enables high-precision duty ratio correction of a clock signal, and high-speed stabilization of a duty ratio.

Sixth Example Embodiment

[Configuration]

Figure 13:
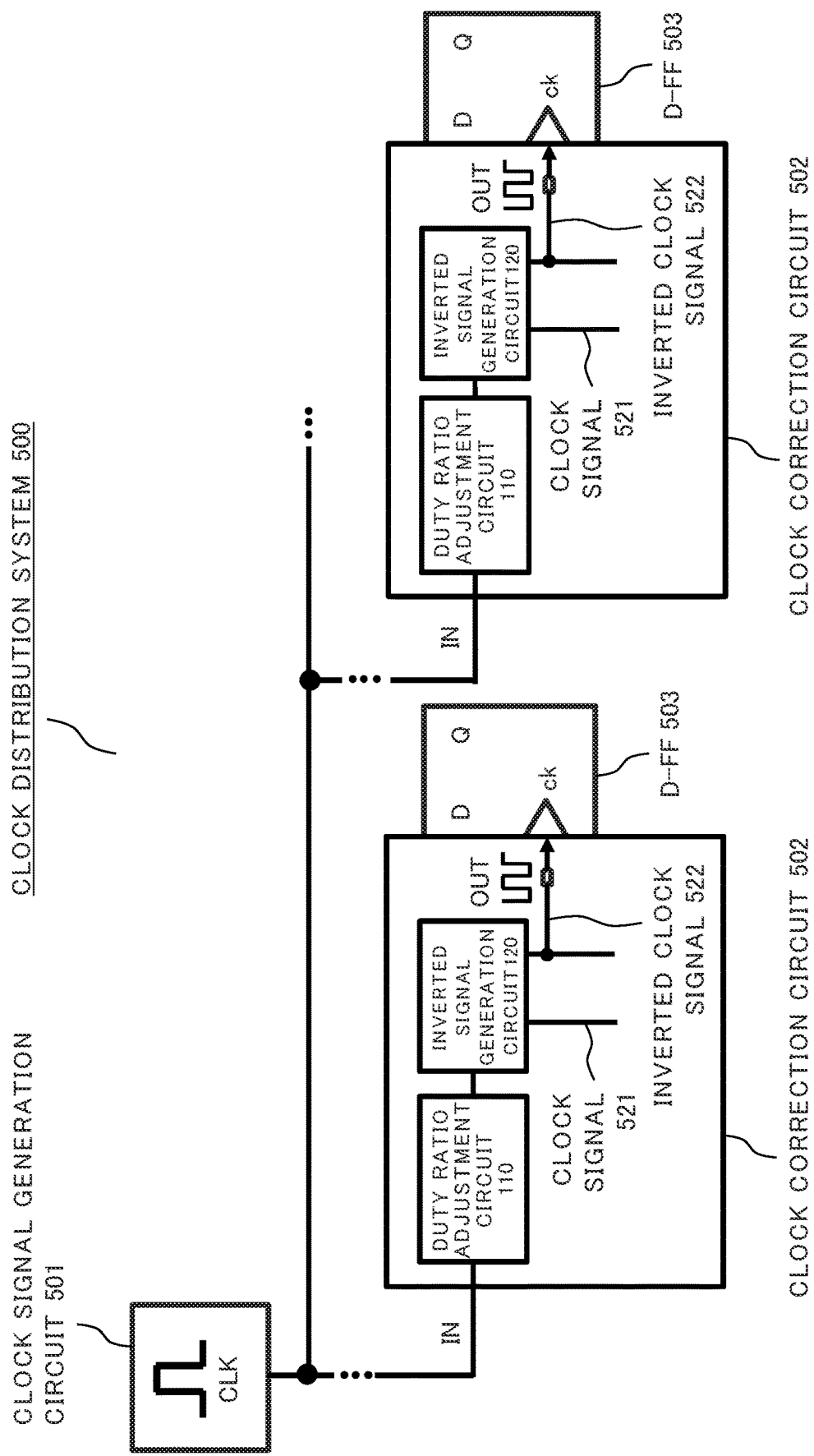
FIG. 13 is a diagram illustrating a configuration example of the duty ratio correction circuit.
Figure 14:
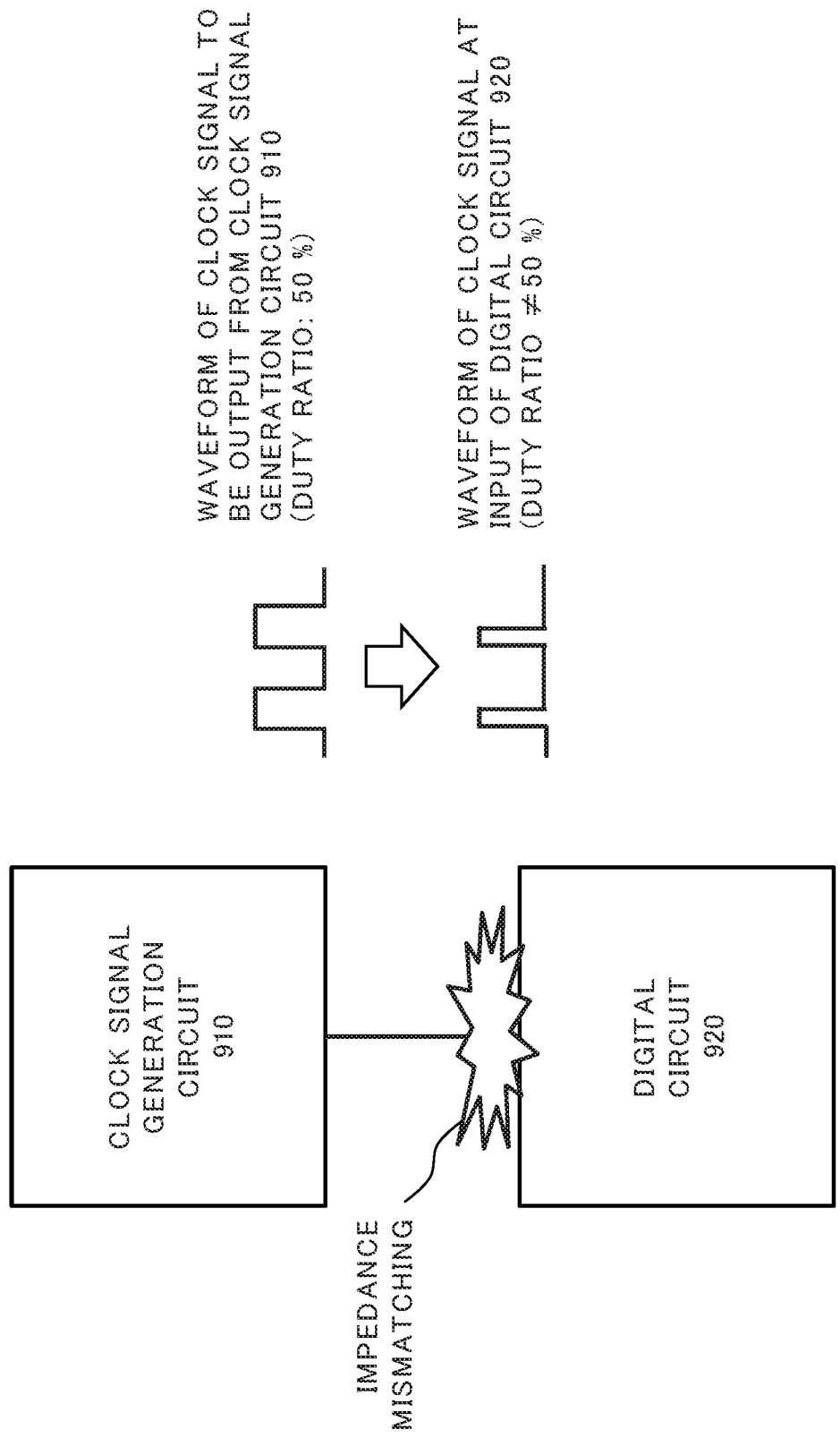
FIG. 14 is a diagram illustrating supply of a clock signal from a clock signal generation circuit to a digital circuit.
Figure 15:
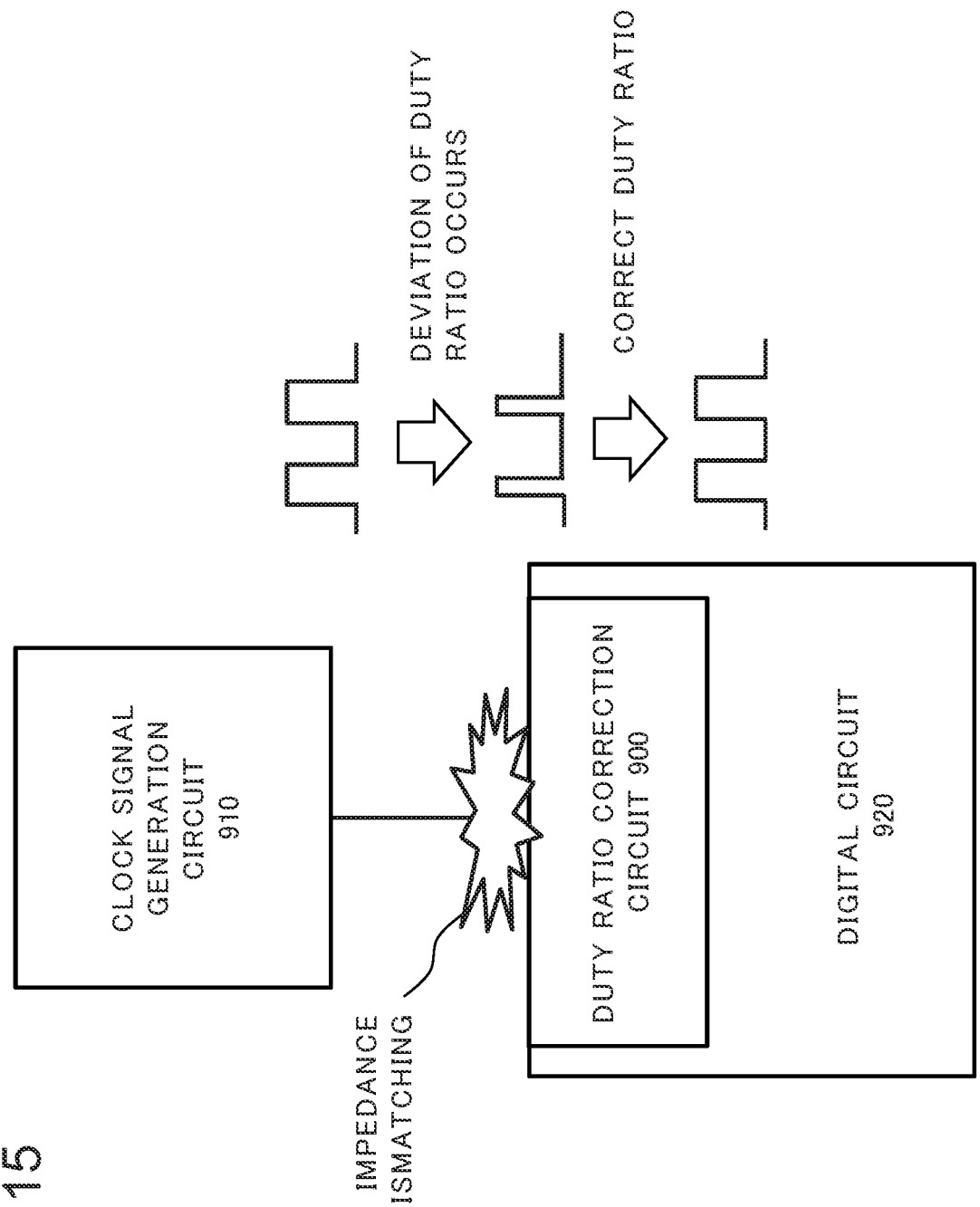
FIG. 15 is a diagram illustrating a general duty ratio correction circuit.
Figure 16:
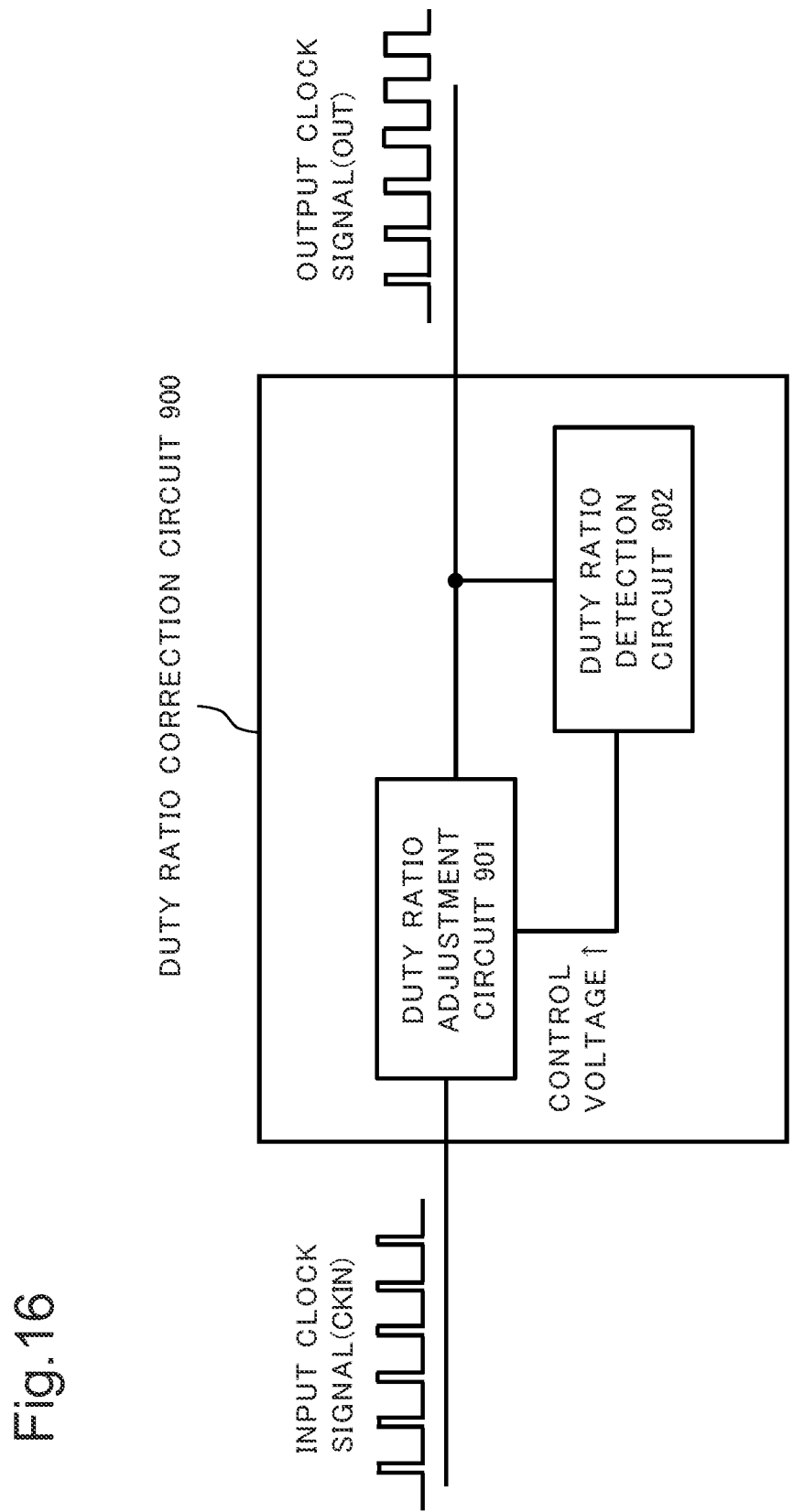
FIG. 16 is a diagram illustrating a configuration of the general duty ratio correction circuit.
Figure 17:
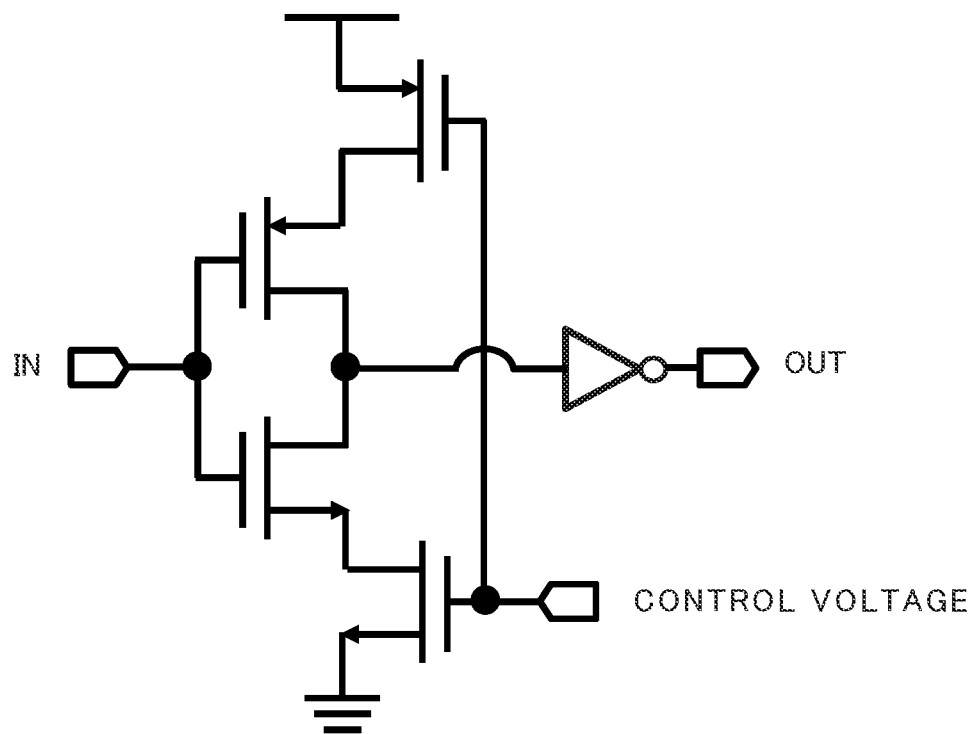
FIG. 17 is a diagram illustrating a circuitry diagram of a general duty ratio adjustment circuit.
Figure 18:
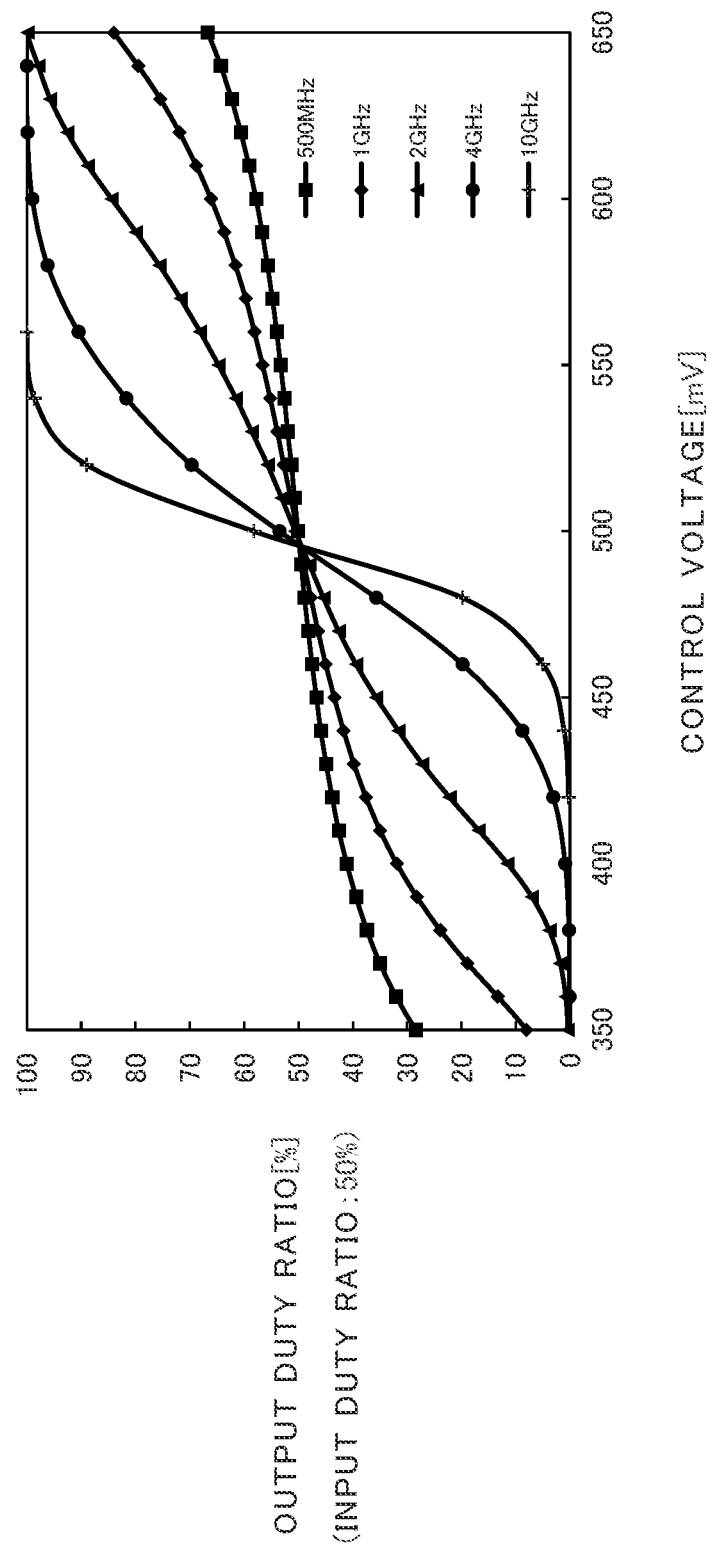
FIG. 18 is a diagram illustrating an example of a relationship between a control voltage and a duty ratio.
Figure 19:
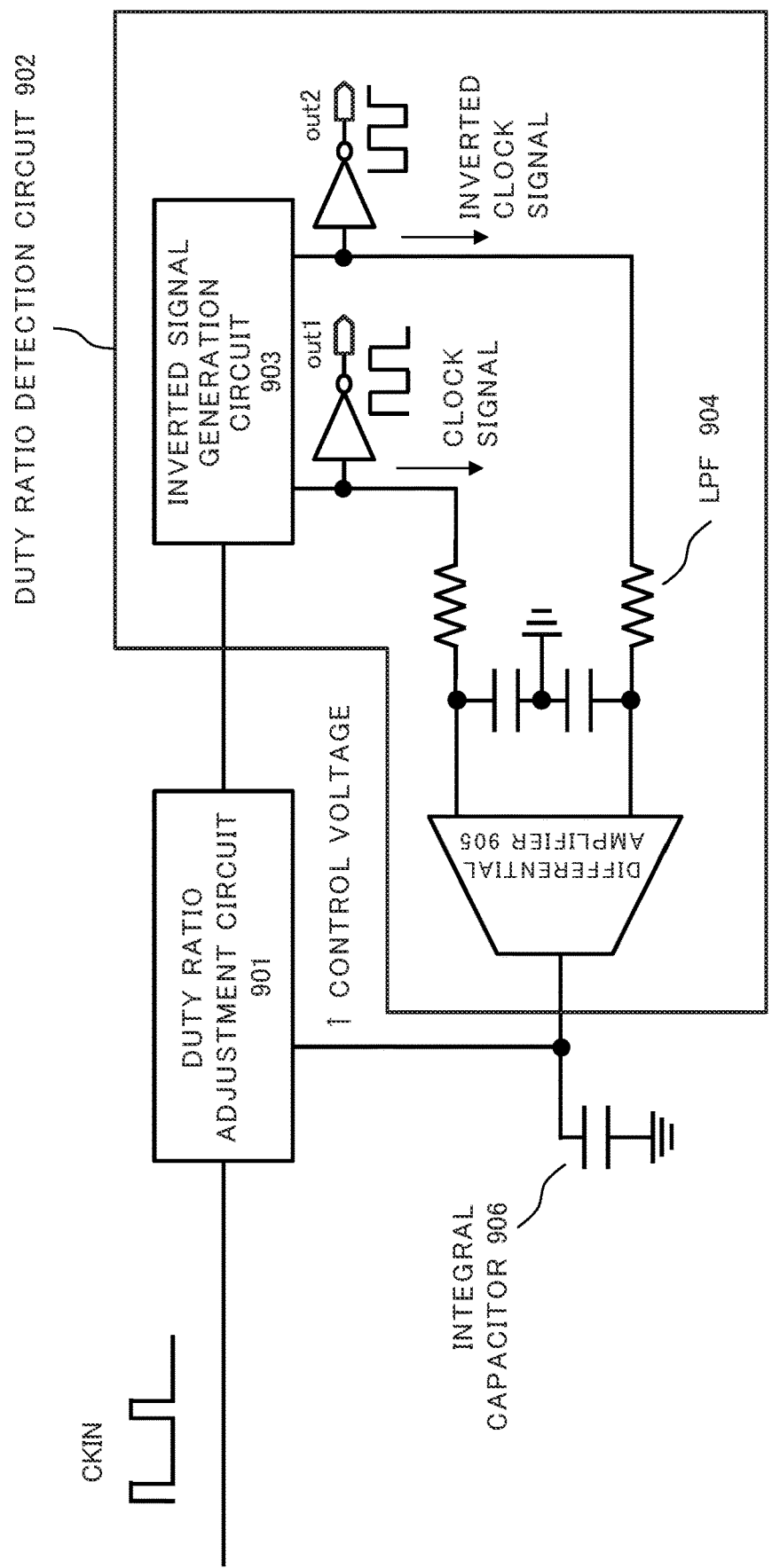
FIG. 19 is a diagram illustrating a configuration example of a general duty ratio detection circuit.
Figure 20:
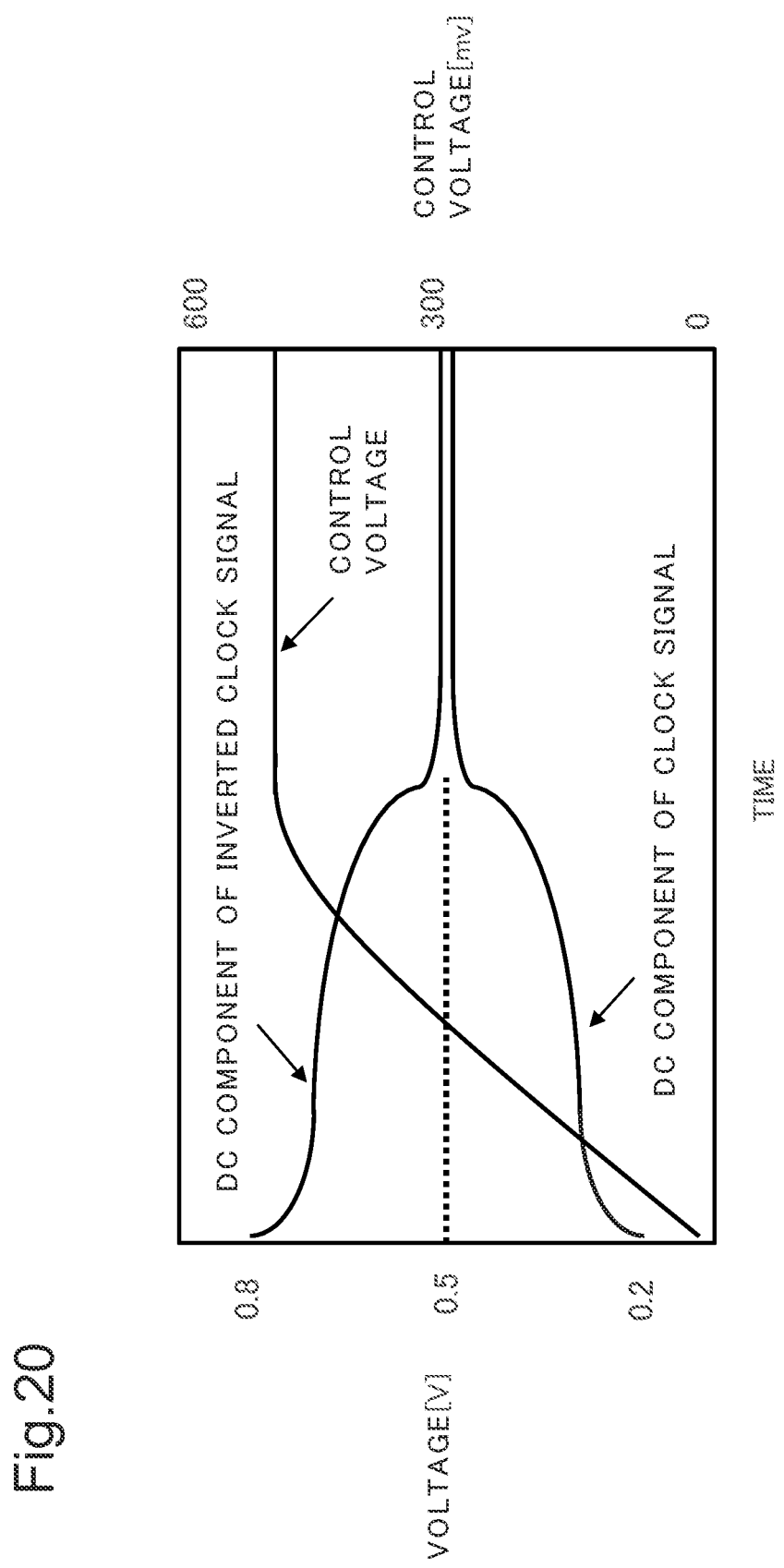
FIG. 20 is a diagram illustrating a DC component of each of a clock signal and an inverted clock signal, and a control voltage over time.

FIG. 13 is a diagram illustrating a configuration example of a clock distribution system 500 according to a present disclosure. The clock distribution system 500 includes a clock signal generation circuit 501, a plurality of clock correction circuits 502, and a plurality of D-flipflops (D-FFs) 503. As the clock correction circuit 502, the duty ratio correction circuits 10, 100, 101, 102, and 103 described in each example embodiment can be used. In FIG. 13, to simplify the drawing, only a duty ratio adjustment circuit 110 and inverted signal generation circuit 120 are described in the clock correction circuit 502, and description of other constituent elements is omitted.

[Operation]

The plurality of clock correction circuits 502 and D-FFs 503 are disposed in parallel, and a clock signal is input from the clock correction circuit 502 to a clock input of each of the D-FFs 503. Note that, the D-FF 503 is an example, and another logic circuit may be employed. The clock correction circuit 502 adjusts a duty ratio in such a way that a duty ratio of a clock signal generated in the clock signal generation circuit 501 becomes 50%, and outputs the signal, as a clock signal 521 and an inverted clock signal 522. In the present example embodiment, the D-FF 503 synchronizes a data signal to be input to a D terminal with a clock by using the inverted clock signal 522 output from the clock correction circuit 502. The clock signal 521 may be supplied to the D-FF 503.

Since the clock distribution system 500 including a configuration as described above includes the plurality of clock correction circuits 502, a clock signal in which a duty ratio is corrected can be supplied from a closest position to a digital circuit (e.g., the D-FF 503) requiring a clock signal. Note that, the clock correction circuit 502 may supply the clock signal 521 or the inverted clock signal 522 to a digital circuit other than the D-FF 503.

Note that, the example embodiments according to the present disclosure may also be described as the following Supplementary notes, but are not limited thereto.

(Supplementary Note 1)

A duty ratio correction circuit including:
a duty ratio adjustment means for adjusting a duty ratio of an input first clock signal, based on a control signal, and outputting, as a second clock signal, the first clock signal in which the duty ratio is adjusted;
an inverted signal generation means for receiving the second clock signal, and outputting an output clock signal having a phase of the second clock signal, and an inverted clock signal being a signal in which a phase of the output clock signal is inverted;
a delay means for causing a delay of a delay amount associated to a half cycle of the output clock signal between the output clock signal and the inverted clock signal; and
a differential amplification means for outputting, to the duty ratio adjustment means, as the control signal, a signal in which a difference in amplitude between the output clock signal and the inverted clock signal that are output from the delay means is amplified.

(Supplementary Note 2)

The duty ratio correction circuit according to Supplementary note 1, wherein
the delay means delays the inverted clock signal.

(Supplementary Note 3)

The duty ratio correction circuit according to Supplementary note 1 or 2, wherein
the delay means delays the output clock signal or the inverted clock signal by even-numbered inverters.

(Supplementary Note 4)

The duty ratio correction circuit according to any one of Supplementary notes 1 to 3, further including:
a low pass filter provided between the delay means and the differential amplification means; and
an integral capacitor provided at an output of the differential amplification means.

(Supplementary Note 5)

The duty ratio correction circuit according to any one of Supplementary notes 1 to 4, wherein
the delay means includes a plurality of delay elements, and the delay amount is adjusted by switching the number of series connections of the plurality of delay elements.

(Supplementary Note 6)

A clock distribution system including:
a plurality of clock correction circuits each being the duty ratio correction circuit according to any one of Supplementary notes 1 to 5;
a clock signal generation circuit that distributes the first clock signal to each of the plurality of clock correction circuits; and
a plurality of digital circuits each to be connected to the inverted signal generation means included in each of the plurality of clock correction circuits, and receive, from the inverted signal generation means, at least one of the output clock signal and the inverted clock signal.

(Supplementary Note 7)

A duty ratio correction method including:
adjusting a duty ratio of an input first clock signal, based on a control signal;
outputting, as a second clock signal, the first clock signal in which the duty ratio is adjusted;
outputting an output clock signal having a phase of the second clock signal;
outputting an inverted clock signal being a signal in which a phase of the output clock signal is inverted;
causing a delay of a delay amount associated to a half cycle of the output clock signal between the output clock signal and the inverted clock signal; and
outputting, as the control signal, a signal in which a difference in amplitude between the output clock signal and the inverted clock signal that are subjected to processing of causing the delay is amplified.

In the foregoing, the present disclosure has been described with reference to the example embodiments, but the present disclosure is not limited to the above example embodiments. A configuration and details of the present disclosure can be modified in various ways comprehensible to a person skilled in the art within the scope of the present disclosure. Further, description on a duty ratio correction circuit according to each example embodiment also disclosures a duty ratio correction method, and a logic circuit using a duty ratio correction circuit.

Further, a configuration described in each of the example embodiments is not necessarily mutually exclusive. An operation and an advantageous effect of the present disclosure may be achieved by a configuration in which all or a part of the above example embodiments are combined.

A procedure of processing of the duty ratio correction circuit described in each example embodiment also disclosures a duty ratio correction method. Further, a function and a procedure of the duty ratio correction circuit described in each example embodiment may be achieved by causing a central processing unit (CPU) included in the duty ratio correction circuit to execute a program. The program is recorded in a fixed non-transitory recording medium. As the recording medium, a semiconductor memory or a fixed magnetic disk device is used, but the recording medium is not limited thereto.

The invention claimed is:

1. A duty ratio correction circuit comprising:
a duty ratio adjustment circuit configured to adjust a duty ratio of an input first clock signal, based on a control signal, and to output, as a second clock signal, the first clock signal in which the duty ratio is adjusted;
an inverted signal generation circuit configured to receive the second clock signal, and to output an output clock signal having a phase of the second clock signal, and an inverted clock signal that is a signal in which a phase of the output clock signal is inverted;
a delay circuit configured to receive as a delay circuit input signal one of the output clock signal and the inverted clock signal, and cause a delay of the delay circuit input signal by an adjustable delay amount associated with a half cycle of the output clock signal; and
a differential amplification circuit configured to output, to the duty ratio adjustment circuit, as the control signal, a signal in which a difference in amplitude between a signal output from the delay circuit and the other of the output clock signal and the inverted clock signal that is not the delay circuit input signal received by the delay circuit, is amplified.

2. The duty ratio correction circuit according to claim 1, wherein
the delay circuit delays the inverted clock signal.

3. The duty ratio correction circuit according to claim 2, wherein
the delay circuit delays the delay circuit input signal by an even number of inverters.

4. The duty ratio correction circuit according to claim 2, further comprising:
   a low pass filter is provided between the delay circuit and the differential amplification circuit; and
   an integral capacitor is provided at an output of the differential amplification circuit.

5. The duty ratio correction circuit according to claim 2, wherein
   the delay circuit includes a plurality of delay elements, and the delay amount is adjusted by switching a number of series connections of the plurality of delay elements.

6. The duty ratio correction circuit according to claim 1, wherein
   the delay circuit delays the delay circuit input signal by an even number of inverters.

7. The duty ratio correction circuit according to claim 1, further comprising:
   a low pass filter is provided between the delay circuit and the differential amplification circuit; and
   an integral capacitor is provided at an output of the differential amplification circuit.

8. The duty ratio correction circuit according to claim 1, wherein
   the delay circuit includes a plurality of delay elements, and the delay amount is adjusted by switching a number of series connections of the plurality of delay elements.

9. A clock distribution system comprising:
   a plurality of clock correction circuits each including:
      a duty ratio adjustment circuit configured to adjust a duty ratio of an input first clock signal, based on a control signal, and to output, as a second clock signal, the first clock signal in which the duty ratio is adjusted;
      an inverted signal generation circuit configured to receive the second clock signal, and to output an output clock signal having a phase of the second clock signal, and an inverted clock signal that is a signal in which a phase of the output clock signal is inverted;
      a delay circuit configured to receive as a delay circuit input signal one of the output clock signal and the inverted clock signal, and cause a delay of the delay circuit input signal by an adjustable delay amount associated with a half cycle of the output clock signal; and
      a differential amplification circuit configured to output, to the duty ratio adjustment circuit, as the control signal, a signal in which a difference in amplitude between a signal output from the delay circuit and the other of the output clock signal and the inverted clock signal that is not the delay circuit input signal received by the delay circuit, is amplified;
   a clock signal generation circuit configured to distribute the first clock signal to each of the plurality of clock correction circuits; and
   a plurality of digital circuits each configured to be connected to the inverted signal generation circuit included in each of the plurality of clock correction circuits, and to receive, from the inverted signal generation circuit, at least one of the output clock signal and the inverted clock signal.

10. A duty ratio correction method comprising:
adjusting a duty ratio of an input first clock signal, based on a control signal;
outputting, as a second clock signal, the first clock signal in which the duty ratio is adjusted;
outputting an output clock signal having a phase of the second clock signal;
outputting an inverted clock signal being a signal in which a phase of the output clock signal is inverted;
causing a delay, by an adjustable delay amount, of one of the output clock signal and the inverted clock signal, wherein the delay amount is associated with a half cycle of the output clock signal; and
outputting, as the control signal, a signal in which a difference in amplitude between one of the output clock signal and the inverted clock signal that is subjected to the adjustable delay amount and the other of the output clock signal and the inverted clock signal, is amplified.

* * * * *